(12) United States Patent
Flammer et al.

(10) Patent No.: US 7,371,970 B2
(45) Date of Patent: May 13, 2008

(54) RIGID-FLEX CIRCUIT BOARD SYSTEM

(76) Inventors: Jeffrey D. Flammer, 11226 N. 75th St., Scottsdale, AZ (US) 85260; Robert Forcier, 2448 N. Rose St., Mesa, AZ (US) 85213

( * ) Notice: Subject to any disclaimer, the term of this patent is extended or adjusted under 35 U.S.C. 154(b) by 375 days.

(21) Appl. No.: 10/731,390

(22) Filed: Dec. 8, 2003

(65) Prior Publication Data

US 2004/0118595 A1    Jun. 24, 2004

Related U.S. Application Data

(60) Provisional application No. 60/431,239, filed on Dec. 6, 2002.

(51) Int. Cl.
 *H05K 1/03* (2006.01)
(52) U.S. Cl. ................... 174/255; 174/254
(58) Field of Classification Search ........ 361/749–751, 361/780, 781; 174/254, 255, 261, 259
 See application file for complete search history.

(56) References Cited

U.S. PATENT DOCUMENTS

| | | | | |
|---|---|---|---|---|
| 3,766,439 A | * | 10/1973 | Isaacson | 361/714 |
| 4,028,509 A | * | 6/1977 | Zurcher | 200/5 A |
| 4,173,035 A | * | 10/1979 | Hoyt | 362/249 |
| 4,680,675 A | * | 7/1987 | Sato | 361/748 |
| 4,687,695 A | * | 8/1987 | Hamby | 428/192 |
| 5,072,074 A | * | 12/1991 | DeMaso et al. | 174/254 |
| 5,121,297 A | * | 6/1992 | Haas | 361/751 |
| 5,428,190 A | * | 6/1995 | Stopperan | 174/261 |
| 5,434,362 A | * | 7/1995 | Klosowiak et al. | 174/254 |
| 5,997,738 A | * | 12/1999 | Lin | 210/195.1 |
| 6,099,745 A | * | 8/2000 | McKenney et al. | 216/13 |
| 6,350,387 B2 | * | 2/2002 | Caron et al. | 430/314 |
| 6,665,170 B1 | * | 12/2003 | Warner et al. | 362/317 |
| 6,762,942 B1 | * | 7/2004 | Smith | 361/749 |

FOREIGN PATENT DOCUMENTS

JP     2001-036246    *  9/2001

* cited by examiner

*Primary Examiner*—Ishwar (I. B.) Patel
(74) *Attorney, Agent, or Firm*—Stoneman Volk Patent Group; Martin L. Stoneman; Michael D. Volk, Jr.

(57) ABSTRACT

A rigid-flex circuit board system that can be manufactured using less expensive and more reliable rigid circuit board methods and equipment, and can maintain rigidity and dimensional stability until the time when it is first desired to flex.

15 Claims, 20 Drawing Sheets

RIGID-FLEX CIRCUIT BOARD SYSTEM

CROSS-REFERENCE TO RELATED APPLICATION

The present application claims the benefit of provisional application Ser. No. 60/431,239, filed Dec. 6, 2002, entitled "FLEXIBLE PRINTED CIRCUIT BOARD AND METHOD FOR THE FABRICATION THEREOF", the contents of which are incorporated herein by this reference and is not admitted to be prior art with respect to the present invention by the mention in this cross-reference section.

BACKGROUND

This invention relates to providing a rigid-flex circuit board system which can be produced more efficiently and has greater functionality than prior art rigid-flex circuit boards. In the past, manufacturing rigid flex circuit boards has been problematic. Many factors, difficult to control given current manufacturing techniques, result in high scrap rates (circuit boards that do not work). For example, in the past, it has been troublesome to align flexible printed circuit layers with rigid printed circuit layers since the flexible printed circuit layers are not dimensionally stable (the flexible portions stretch, warp, shrink, etc.). This dimensional instability introduces a significant degree of variability in the manufacturing process. On a rigid printed circuit board, the location of the traces, and the pads for drilling and mounting components, etc. can be located with great reliability. Rigid board manufacturing processes can typically rely on determining the locations of the traces and pads etc. from registering just a couple points on the rigid board. With flexible printed circuit boards, locations of traces and pads cannot be as reliably mapped and registered since the flexibility results in the traces and pads etc., shifting by variable amounts. As a result, when flexible printed circuit layers are laminated to rigid circuit boards the connections between the two layers (at the interface) may not be aligned properly throughout due to the inconsistencies caused by dimensional instability of the flexible layer (with the result that the circuit board will not work properly, and must be scrapped, which is wasteful and expensive). In order to increase reliability (and reduce scrap) in manufacturing rigid-flex circuit boards, more expensive machinery and more complicated processes are used (than for manufacturing standard rigid boards). In the past, those attempting to reduce scrap, utilizing available manufacturing techniques, have also sacrificed the number and density of connections between the rigid and flexible layers, since these connections have been problematic (for the above reasons). However, as is well known in the industry, achieving higher densities can have many benefits (such as, for example, reduced size, reduced energy consumption, increased speed, etc.).

Further, even if the flexible layers are successfully connected to the rigid layers, later manufacturing steps are often still troublesome (and more expensive than standard rigid board manufacturing) as a result of the dimensional instability (variable stretching) introduced by the flexible portions. For example, reliability in soldering components to a rigid-flex board may be reduced due dimensional instability. Any fabrication and component assembly process involving handling the rigid-flex boards may be complicated due to portions of the board "flopping around" etc.

In the past (since mechanical support is needed during the assembly process of placing components, reflow of the solder process, and for installation in the housing, etc.) stiffeners (without conductive layers and without electrical connections/function) have been added to flex layers to provide such mechanical support. Also, in the past, manufacturing flexible circuits has been complicated by the need to use stabilization frames and/or rigid leaders and/or specialty plating racks in order to provide support for flexible portions of circuit boards during the manufacturing process. These methods add complexity, cost and increased scrap rates, to the manufacturing process.

These are just a few of the many complications that make manufacturing and manipulating flexible and rigid-flex circuit boards more difficult and expensive than standard rigid boards.

OBJECTS AND FEATURES OF THE INVENTION

A primary object and feature of the present invention is to provide a rigid-flex circuit board system that is efficient to manufacture. It is a further object and feature of the present invention to provide such a rigid-flex circuit board system that can be manufactured using standard rigid circuit board methods and equipment.

It is a further object and feature of the present invention to provide such a rigid-flex circuit board system that can maintain rigidity and dimensional stability until the time when it is first desired to flex.

It is a further object and feature of the present invention to provide such a rigid-flex circuit board system that have dimensional stability and mechanical support throughout the manufacturing process (provided by the continuity of the rigid layer until the structurally weakened rigid layer is bent/broken) thereby eliminating the need for additional stiffeners, stabilization frames, rigid leaders, plating racks, etc.

A further primary object and feature of the present invention is to provide such a system that is efficient, inexpensive, and handy. Other objects and features of this invention will become apparent with reference to the following descriptions.

SUMMARY OF THE INVENTION

A rigid-flex printed circuit board system comprising, in combination: at least one rigid layer; at least one flexible layer bonded to at least one portion of such at least one rigid layer; wherein such at least one rigid layer comprises at least one structural weakness at at least one selected location; wherein such at least one structural weakness is adapted to facilitate breaking such at least one rigid layer at such at least one selected location into at least two pieces to provide a flexible connection formed by such at least one flexible layer between such pieces. Moreover, it provides such a rigid-flex printed circuit board system wherein such structural weakness comprises at least one score. Additionally, it provides such a rigid-flex printed circuit board system wherein: such at least one rigid layer comprises at least one top side, and at least one bottom side; such structural weakness comprises at least one score on such at least one top side at such at least one selected location, and at least one score on such at least one bottom side at such at least one selected location. Also, it provides such a rigid-flex printed circuit board system wherein such structural weakness comprises at least one gap at such selected location between such at least one rigid layer and such at least one flexible layer. In addition, it provides such a rigid-flex printed circuit board system further comprising: at least one adhesive to bond at least one portion of such at least one flexible layer to at least one portion of such at least one rigid layer; wherein such structural weakness comprises selective absence of adhesive at such selected location between such at least one rigid layer and such at least one flexible layer. And, it provides such a rigid-flex printed circuit board system wherein such structural weakness comprises at least one laser score. Further, it provides such a rigid-flex printed circuit board system wherein such structural weakness comprises at least one mechanical score. Even further, it provides such a rigid-flex printed circuit board system wherein such at least one rigid layer comprises epoxy. Moreover, it provides such a rigid-flex printed circuit board system wherein such at least one rigid layer comprises metal. Additionally, it provides such a rigid-flex printed circuit board system wherein such at least one rigid layer comprises epoxy reinforced fiberglass. Also, it provides such a rigid-flex printed circuit board system wherein such at least one flexible layer comprises polyimide. In addition, it provides such a rigid-flex printed circuit board system wherein: such at least one flexible layer comprises at least one substantially flexible insulating layer, and at least one substantially flexible conductive layer; and such at least one rigid layer comprises at least one substantially rigid insulating layer, and at least one conductive layer.

In accordance with another preferred embodiment hereof, this invention provides a rigid-flex printed circuit board system comprising, in combination: at least one substantially rigid layer; at least one substantially flexible layer bonded to at least one portion of such at least one substantially rigid layer; wherein such at least one substantially rigid layer comprises at least one structural weakness at at least one selected location to facilitate bending such at least one rigid layer at such at least one selected location to provide at least one flexible connection. And, it provides such a rigid-flex printed circuit board system wherein such at least one substantially rigid layer comprises metal. Further, it provides such a rigid-flex printed circuit board system wherein such at least one substantially rigid layer comprises aluminum. Even further, it provides such a rigid-flex printed circuit board system wherein such at least one structural weakness comprises at least one groove. Moreover, it provides such a rigid-flex printed circuit board system wherein such at least one structural weakness comprises at least one chemically milled groove.

In accordance with another preferred embodiment hereof, this invention provides a process of fabricating a rigid-flex printed circuit board system comprising the steps of: bonding at least one portion of at least one flexible layer to at least one portion of at least one rigid layer; peeling at least one portion of such at least one flexible layer away from such at least one rigid layer, at at least one selected location, to provide at least one flexible circuit portion. Additionally, it provides such a process of fabricating a rigid-flex printed circuit board system further comprising the step of structurally weakening at least a portion of such flexible layer to assist in such peeling. Also, it provides such a process of fabricating a rigid-flex printed circuit board system further comprising the step of cutting at least one portion of such flexible layer to assist in such peeling. In addition, it provides such a process of fabricating a rigid-flex printed circuit board system wherein: such bonding comprises selectively applied adhesive; such adhesive is selectively applied to substantially omit adhesive from being applied, at such at least one selected location, between such at least one flexible layer and such at least one rigid layer to assist in such peeling. And, it provides such a process of fabricating a rigid-flex printed circuit board system further comprising the steps of: applying an adhesive to form such bonding; selectively removing at least one portion of such adhesive, at such at least one selected location, between such at least one flexible layer and such at least one rigid layer to assist in such peeling.

In accordance with another preferred embodiment hereof, this invention provides a process of fabricating a rigid-flex printed circuit board system comprising the steps of: bonding at least one portion of at least one flexible layer to at least one portion of at least one rigid layer; breaking at least one portion of such at least one rigid layer, at at least one selected location, into at least two pieces; wherein such at least one flexible layer provides a flexible connection, at such at least one selected location, between such at least two pieces. Further, it provides such a process of fabricating a rigid-flex printed circuit board system further comprising the step of structurally weakening, at such at least one selected location, at least one portion of such at least one rigid layer to assist in such breaking. Even further, it provides such a process of fabricating a circuit board system further comprising the step of scoring such at least one rigid layer, at such at least one selected location, to assist in such breaking. Moreover, it provides such a process of fabricating a rigid-flex printed circuit board system wherein such scoring comprises a process selected from the group consisting of laser scoring mechanically scoring mechanically punching. Additionally, it provides such a process of fabricating a rigid-flex printed circuit board system further comprising the steps of: applying an adhesive to form such bonding; selectively removing at least a portion of such adhesive, at such at least one selected location, between such flexible layer and such rigid layer to assist in such breaking. Also, it provides such a process of fabricating a rigid-flex printed circuit board system wherein: such bonding comprises selectively applied adhesive; such adhesive is selectively applied to substantially omit adhesive from being applied, at such at least one selected location, between such flexible layer and such rigid layer to assist in such breaking.

In accordance with another preferred embodiment hereof, this invention provides a process of fabricating a rigid-flex printed circuit board system comprising to steps of: bonding at least one flexible layer to at least one rigid layer; wherein such flexible layer comprises a conductive layer; etching such flexible layer after such flexible layer has been bonded to such outer surface of such rigid layer; breaking, at a selected location, at least one portion of such rigid layer into at least two rigid pieces after such flexible layer has been bonded to such outer surface of such rigid layer; wherein such flexible layer provides a flexible connection, at the location of the break, between such pieces of such rigid layer. In addition, it provides such a process of fabricating a rigid-flex printed circuit board system further comprising the step of selective removal of at least a portion of such rigid layer to assist in such breaking. And, it provides such a process of fabricating a rigid-flex printed circuit board system wherein at least one laser is used to accomplish at least a portion of such selective removal. Further, it provides such a process of fabricating a rigid-flex printed circuit board system wherein mechanical abrasion is used to accomplish at least a portion of such selective removal. Even further, it provides such a process of fabricating a circuit board system wherein mechanical impact is used to accomplish at least a portion of such selective removal. Moreover, it provides such a process of fabricating a rigid-flex printed circuit board system further comprising the step of selectively removing at least a portion of such rigid layer, before bonding such at least one flexible layer to at least one outer surface of such rigid layer, to assist in such breaking. Additionally, it provides such a process of fabricating a rigid-flex printed circuit board system further comprising the step of selectively removing at least a portion of adhesive between such flexible layer and such rigid layer to assist in such breaking. Also, it provides such a process of fabricating a rigid-flex printed circuit board system wherein: such flexible layer is bonded to such rigid layer with an adhesive layer; such adhesive layer is selectively applied to avoid placing adhesive at such selected location. In addition, it provides such a process of fabricating a rigid-flex printed circuit board system wherein: such rigid layer comprises material selected from the group consisting essentially of tri-functional and multifunctional epoxy resins, systems reinforced (such as, for example, by fiber glass fabric, etc.) cast coated epoxy and polyimide non-reinforced materials. And, it provides such a process of fabricating a rigid-flex printed circuit board system wherein: such flexible layer comprises material selected from the group consisting essentially of polyimide, mylar, polyester, polyethylene napthalate, with adhesive films such as acrylics, polyesters, phenolic butyral adhesives, and polyimides made up of polyamic acids or esters, In accordance with another preferred embodiment hereof, this invention provides a process of fabricating a rigid-flex printed circuit board system comprising the steps of: laminating at least one portion of at least one flexible layer to at least one portion of at least one rigid layer; imaging and etching at least one portion of such at least one flexible layer to form conductor patterns after such at least one portion of at least one flexible layer has been laminated to such at least one portion of at least one rigid layer; breaking at least one portion of such at least one rigid layer, at at least one selected location, into at least two pieces; wherein such at least one flexible layer provides a flexible conductive connection, at such at least one selected location, between such at least two pieces.

In accordance with another preferred embodiment hereof, this invention provides a rigid-flex printed circuit board system comprising, in combination: insulating means for electrically insulating conductive portions of the rigid-flex printed circuit board; conducting means for conducting electricity through portions of the rigid-flex printed circuit board; rigidity means for providing rigidity to all portions of such conducting means; conversion means for converting portions of rigidity means into a flexible means for flexing portions of such conductor means. Further, it provides such a rigid-flex printed circuit board system according to claim 40 wherein such conversion means comprises structural weakness means for structurally weakening selected portions of such rigidity means.

DETAILED DESCRIPTION OF THE BEST MODE AND PREFERRED EMBODIMENTS OF THE INVENTION

Figure 1:
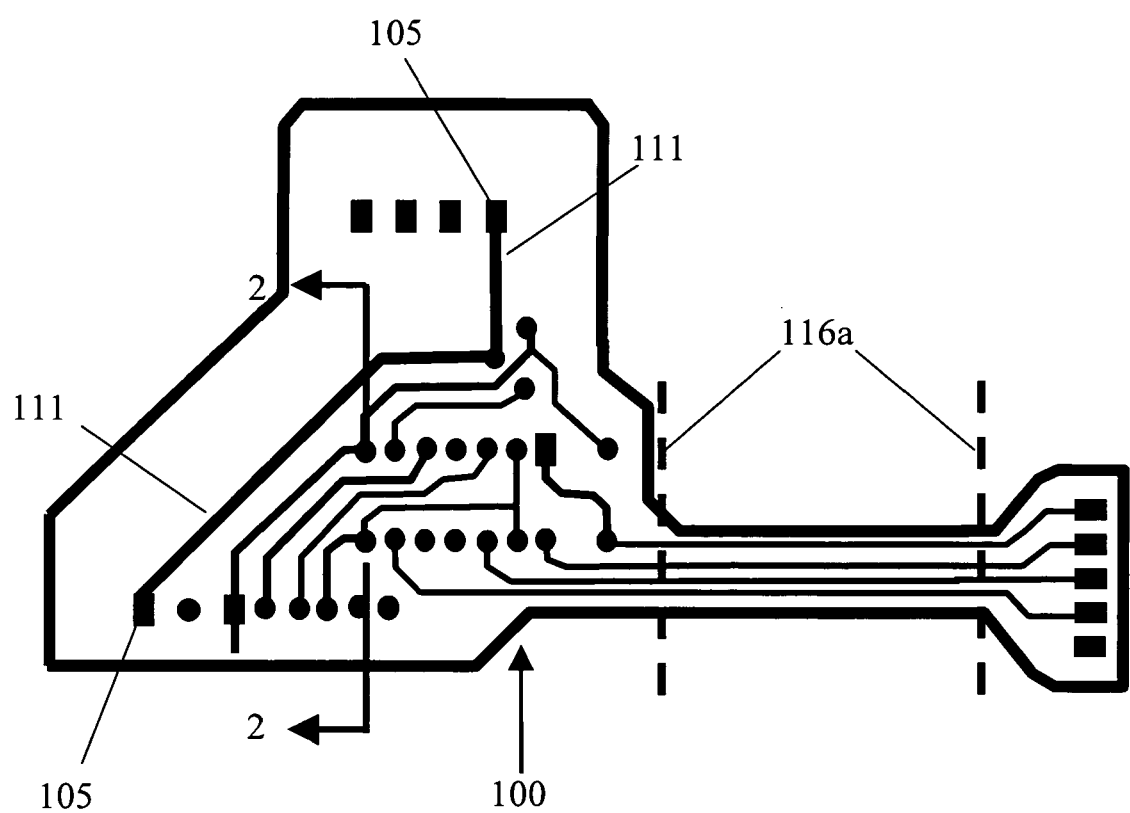
FIG. 1 shows a top view of a rigid-flex circuit board according to a preferred embodiment of the present invention.

FIG. 1 shows a top view of rigid core portion 100 with electrical pads 105 and traces 111, according to a preferred embodiment of the present invention.

Figure 2:
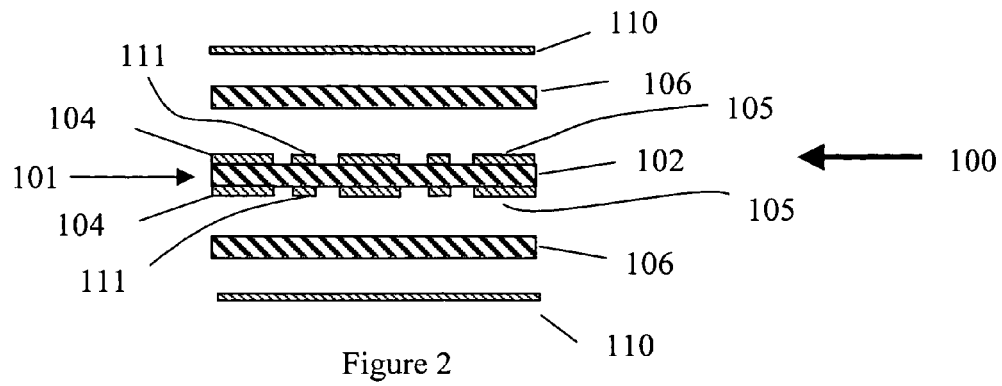
FIG. 2 shows an exploded side view through section 2-2 of FIG. 1 of a rigid core portion of a rigid-flex circuit board.

FIG. 2 shows an exploded side view of rigid core portion 100 of rigid-flex circuit board system 200 according to a preferred embodiment of the present invention. Preferably rigid-flex circuit board system 200 comprises rigid core portion 100, as shown. Preferably, rigid core portion 100 comprises at least one inner layer 101. Preferably inner layer 101 comprises at least one substantially rigid insulating layer 102. Preferably, rigid insulating layer 102 comprises epoxy reinforced with fiberglass. Upon reading the teachings of this specification, those with ordinary skill in the art will now understand that, under appropriate circumstances, considering issues such as production cost, intended use, advances in materials and technology, etc., other rigid insulating layer arrangements may suffice, such as, for example, other types of resins, tri-functional and multifunctional epoxy resins, systems reinforced (such as, for example, by fiber glass fabric, etc.) or non-reinforced materials, aramid fibers, cast coated epoxy or cast polyimide resin systems on copper foil carriers and also thermo-set and thermoplastic film adhesives on release film carriers, polyimides made up of polyamic acids or esters, reinforced by fiberglass fabric or non-reinforced cast film adhesives. Mixed Epoxy resins with cyanate ester and polyolefin adders, and Teflon or FEP (fluorinated ethylene propylene) mixed with glass fiber materials or ceramic filled for high speed circuits, also materials such as ceramic circuit materials used as LTCC (low temperature co-fired ceramic) or HTCC (high temperature co-fired ceramic), metal core base materials or mixed metal alloys cores with CTE (coefficient of thermal expansion) controlling materials embedded in such metals such as nickel, invar and molybdenum, etc. Thermo-set adhesives are thermally cured with cross-linking between polymer chains and will not re-melt with repeated heating. Thermoplastic adhesives are long chain linear polymers that become fluid above their glass transition temperature (Tg) and can be remelted again repeatedly.

Preferably, inner layer 101 comprises at least one conductive layer 104, preferably one conductive layer 104 on top of rigid insulating layer 102 and another conductive layer 104 on bottom of rigid insulating layer 102, as shown. Preferably, conductive layer 104 comprises at least one copper layer bonded to rigid insulating layer 102, as shown. Upon reading the teachings of this specification, those with ordinary skill in the art will now understand that, under appropriate circumstances, considering issues such as advances in materials and technology, production cost, intended use, etc., other conductive layer arrangements may suffice, such as, for example, using copper alloys, conductive materials other than copper, conductive ceramics, superconductive materials, semiconductor silicon wafer materials, piezoelectric compounds as ceramic circuit boards, a single conductive layer instead of multiple conductive layers, etc.

Preferably, conductive layer 104 is processed (such as, for example, by printing and etching, etc.) to form traces 111 and pads 105 and any other circuit board elements formed from the conductive layers of circuit boards known currently (or in the future) to those familiar in the art. Preferably rigid core portion 100 is processed as described herein.

Figure 19A:
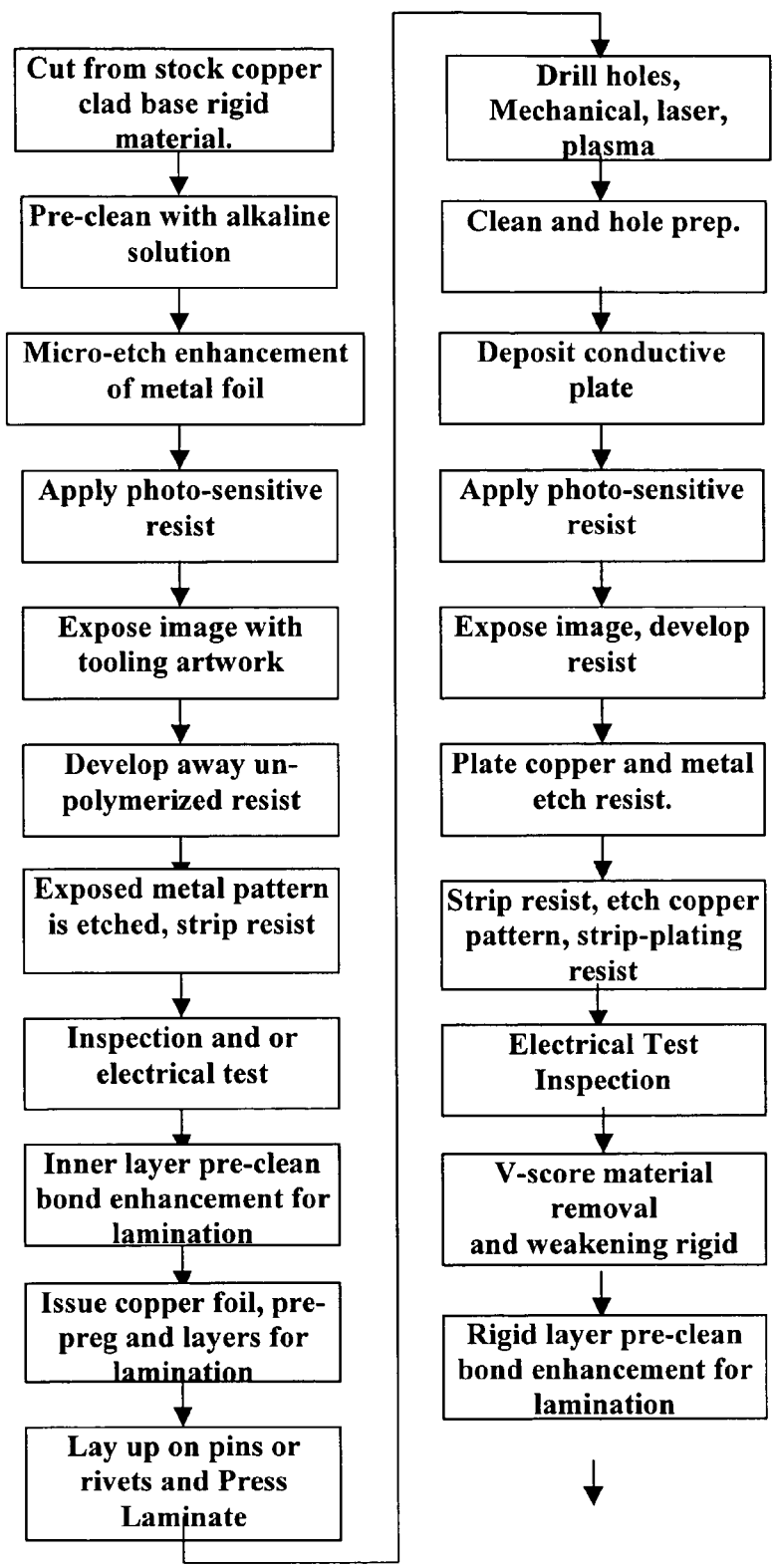
FIG. 19*a* is a flow diagram showing a preferred process for manufacturing rigid-flex according to a preferred embodiment of the present invention.
Figure 19B:
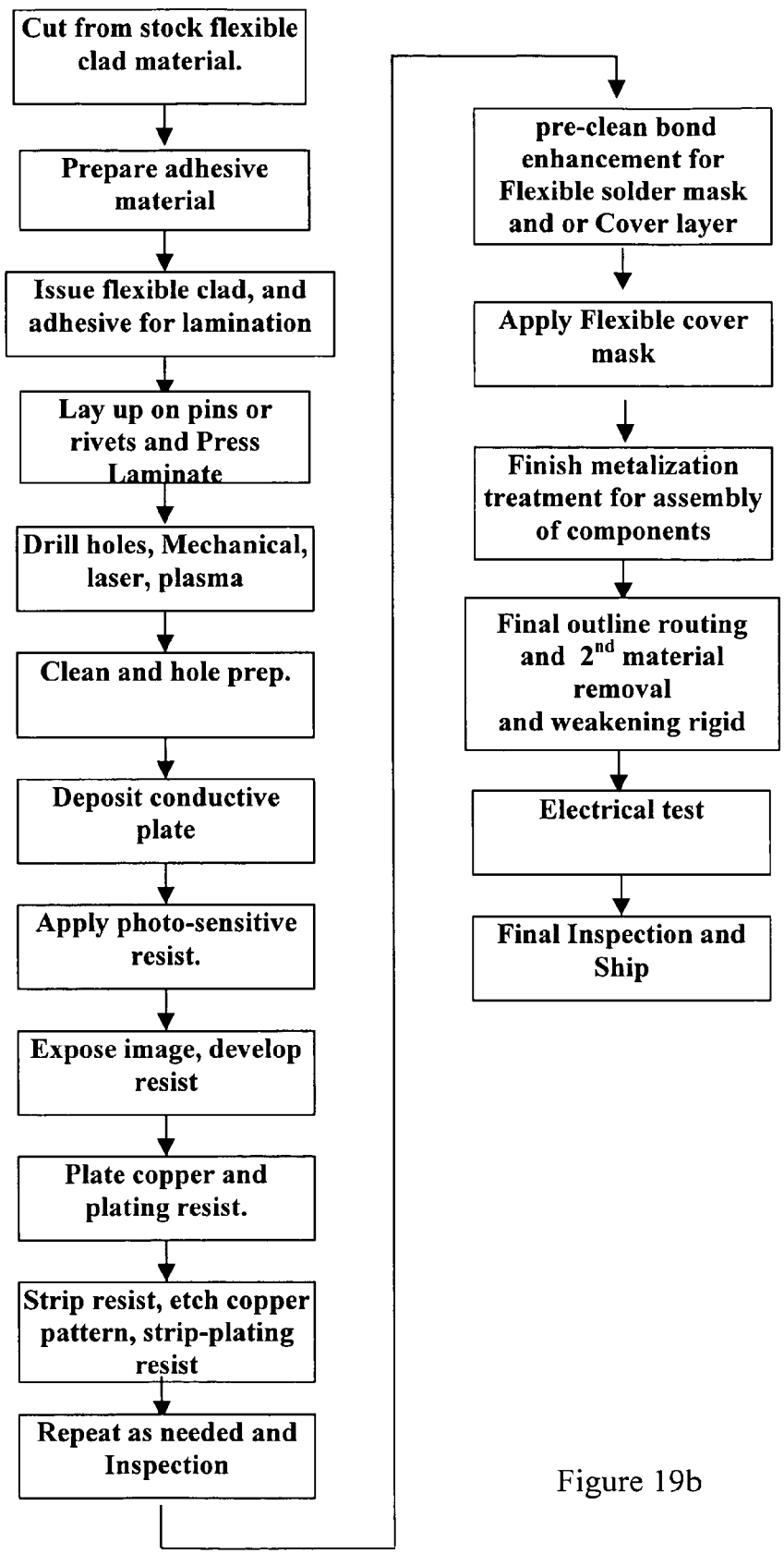
FIG. 19*b* is a flow diagram (a continuation of FIG. 19*a*) showing the remaining steps in a preferred process for manufacturing rigid-flex according to a preferred embodiment of the present invention.

Preferably, rigid core portion 100 is processed according to the flow diagram in FIG. 19*a* and continued in FIG. 19*b*.

FIG. 2 through FIG. 11 show a preferred method for manufacturing a rigid flex printed circuit board according to a preferred embodiment of the present invention.

Preferably conductive layer 104 is bonded to rigid insulating layer 102.

Preferably, conductive layer 104 is cleaned with an alkaline solution (to remove oils, dirt, fingerprints, etc.) Preferably, conductive layer 104 is enhanced with a micro-etch solution (to enlarge the surface area thereby assisting in bonding of the resist).

Preferably, a photosensitive negative or positive acting resist, Dry film or liquid resist is then applied to conductive layer 104.

Preferably, conductive layer 104 is exposed to an image (of the desired conductor patterns of traces 111 and pads 105, etc.) using prepared tooled artwork, which allows polymerized portions of the resist (forming a protective coating over the portions of conductive layer 104 that are to remain as traces 111 and pads 105, etc.).

Preferably, the undeveloped (unpolymerized portions) of the resist (and unprotected portions of conductive layer 104) are etched away, leaving behind conductive patterns of traces 111 and pads 105, etc. Preferably, the polymerized resist is then stripped away.

Preferably, inner layer 101 is electrically tested and inspected.

Preferably, if inner layer 101 passes electrical testing and inspection, inner layer 101 may be laminated together with additional inner layers 101. Rigid core portion 100 may comprise one inner layer 101 or multiple inner layers 101, as shown.

Preferably, when laminating multiple inner layers 101 together, intermediary non-conductive layers 106 are interleaved between conductive layers 104, as shown. Preferably intermediary non-conductive layers 106 comprise b-staged uncured glass reinforced epoxy (also called "pre-preg").

Preferably at least one non-conductive layer 106 and conductive layer 110 are laminated to at least one inner layer 101 of rigid core portion 100, as shown. Preferably conductive layer 110 comprises copper foil.

Preferably pins and or rivets are used to maintain registration of all inner layers 101 for the duration of the lamination process (including during any applied heat, pressure and curing stages).

Upon reading the teachings of this specification, those with ordinary skill in the art will now understand that, under appropriate circumstances, considering issues such as advances in materials and technology, intended use, available machinery, production cost, etc., other rigid core portion assembly arrangements may suffice, such as, for example, omitting steps, adding additional steps, using alternate cleaning methods, using alternate enhancing methods, using alternate printing methods, like laser direct imaging, using alternate plating methods and etching methods, using alternate layer arrangements, using alternate materials, using alternate registration and lamination methods, etc.

Figure 3:
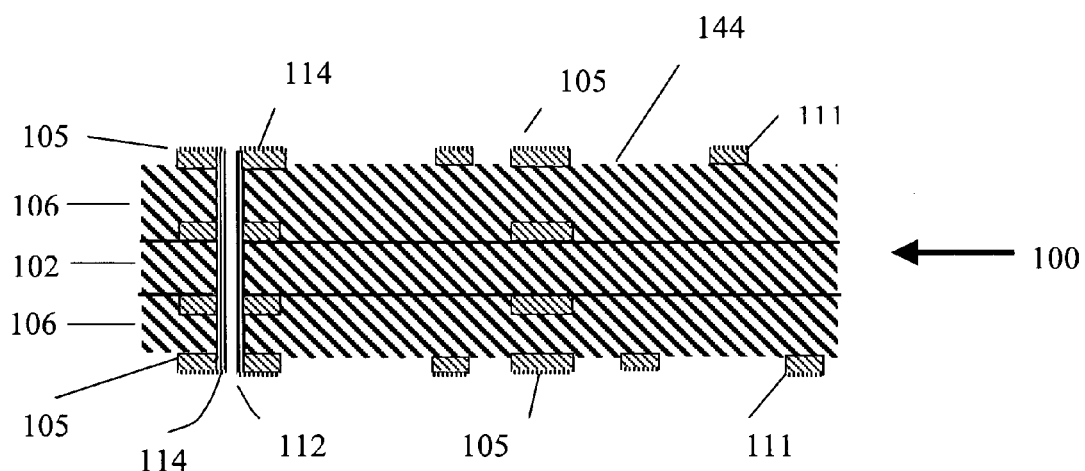
FIG. 3 shows a cross-section side view of the rigid core portion of FIG. 2 after it has been laminated (bonded) together, drilled, plated, printed and etched.

FIG. 3 shows a side view of a rigid core portion 100 which has been laminated (bonded) together, drilled, plated, printed and etched. Preferably, inner layers 101 are interconnected (forming electrical connections) at locations by drilling holes 112 through portions of rigid core portion 100, as shown. Preferably, holes 112 are drilled to between pads 105 on different conductive layers 104 of inner layers 101. Preferably holes 112 are mechanically drilled, laser drilled and or plasma drilled. Holes 112 may be drilled completely through rigid core portion 100, as shown, or may only extend partially through rigid core portion 100. Preferably, conductive material 114 is applied to holes 112 and conductive layer 110 to form electrical connections between pads 115 on different conductive layers, as shown. Preferably, conductive material is applied by plating electroless copper as a seed layer for the subsequent plating operations. Upon reading the teachings of this specification, those with ordinary skill in the art will now understand that, under appropriate circumstances, considering issues such as materials used, production cost, quality control, etc., other conductive material arrangements may suffice, such as, for example, plated conductive carbon polymers, conductive paste coatings, chemical vapor deposition, ion target sputtering methods, etc.

Preferably, conductive material 114 and conductive layer 110 are processed (such as, for example, printed, plated and etched, etc., preferably using the steps outlined above) to form traces 111 and pads 105, etc., on the outer surface of rigid core portion 100, as shown.

Figure 4:
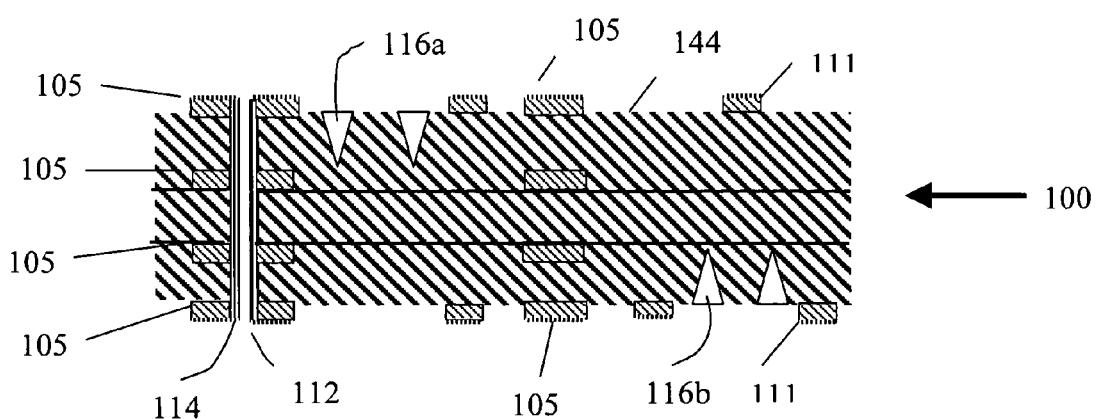
FIG. 4 shows a cross-section side view of the rigid core portion of FIG. 3 after it has been structurally weakened at selected locations.

FIG. 4 shows a side view of a rigid core portion 100 which has been structurally weakened at selected locations. Preferably, rigid core portion 100 is structurally weakened at at least one selected location, creating rigid core weakness 116, as shown. Preferably, rigid core weakness 116 allows rigid core portion 100 to be broken in a substantially reliable and predictable way at the selected location of rigid core weakness 116 (embodying herein conversion means for converting portions of rigidity means into a flexible means for flexing portions of said conductor means; and embodying herein structural weakness means for structurally weakening selected portions of said rigidity means). Preferably rigid core weakness 116 is created by removing rigid core material, preferably by mechanically scoring rigid core portion 100, preferably "v-scoring," as shown. Preferably, rigid core weakness 116 is created on the side of rigid flex 130 that will be concave when the rigid core portion is broken and flexed at the selected location. For example, in FIG. 4, if rigid core portion 100 will eventually be flexed so that it is concave upward at a location, a top rigid core weakness 116*a* should be created (over which a flexible layer will later be added as a flexible connection bridging the gap created when the rigid core portion 100 is broken at that location). Preferably, rigid core weakness 116 is of sufficient depth and width to allow efficient location of rigid core weakness 116 and to provide efficient breaking of rigid core portion 100 at the location when it is time to do so.

Preferably, standard tooling methods are employed (such as, for example, locating a tooling drilled hole) for the placement location of the structural weakening process or method. A mechanical process can maintain a location tolerance of about +/−100 um (0.004"), and laser drilling a fiducial location can be of a tolerance, such as, for example, about +/−50 um (0.002").

Figure 5:
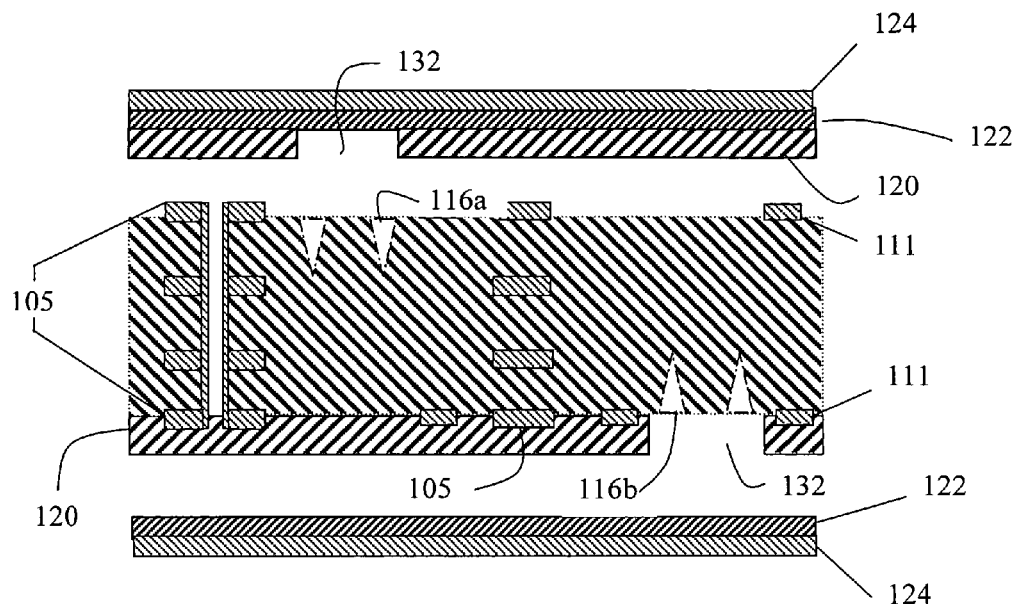
FIG. 5 shows a cross-section side view of the rigid core portion of FIG. 4 with flexible layers about to be attached.

FIG. 5 shows a side view of a rigid core portion 100 to which flexible layers 122 are in the process of being attached. Preferably flexible layers 122 are bonded to rigid core portion 100 with adhesive 120. Preferably, adhesive 120 is selectively applied to rigid core portion 100 leaving gaps 132, preferably where rigid core weakness 116 (and remaining weakened portions 155) are located, as shown. Upon reading the teachings of this specification, those with ordinary skill in the art will now understand that, under appropriate circumstances, considering issues such as material composition of rigid core portion and flexible layer, production cost, quality control, etc., other adhesive arrangements may suffice, such as, for example, using alternative kinds of adhesives such as, for example, pre-preg, different kinds of epoxy, other types of adhesive, selectively applying adhesive 120 to flexible layer 122 (prior to bonding to rigid core portion 100), bonding flexible layer 122 directly to rigid core portion 100 without adhesive, etc. Adhesive 120 may be applied to flexible layer 122 first, or to rigid core portion 100 first, as shown. Upon reading the teachings of this specification, those with ordinary skill in the art will now understand that, under appropriate circumstances, instead of, or in addition to, selectively applying adhesive 120, portions of adhesive 120 may be selectively removed from flexible layer 122 and/or rigid core portion 100 to form gaps 132, preferably where rigid core weakness 116 and weakened portions 155 are located, as shown. Preferably, gaps 132 help preserve structural weakening effect of rigid core weaknesses 116 (otherwise, for example, if adhesive were allowed to cover rigid core weakness 116, the desired structural weakening provided by rigid core weakness 116 could be nullified to an extent by strengthening provided by the adhesive).

Preferably adhesive 120 comprise chemical flow restrictors designed to limit the squeeze out (infiltration) of adhesive into gaps 132. Preferably, adhesive 120 is selectively applied with cut out relief by known methods, such as, for example, applying a liquid adhesive by a screen printing method or by liquid spin coating method. Upon reading the teachings of this specification, those with ordinary skill in the art will now understand that, under appropriate circumstances, considering issues such as flexible layer 122 material, production cost, etc., other adhesive application arrangements may suffice, such as, for example, applying adhesive as a cast film, selectively removing adhesive with a laser, punch die, mechanical abrasion, or other selective adhesive removal methods can be employed such as photoimageable adhesives that can be applied dried, imaged, and developed away for the gaps areas, etc. Preferably gaps 132 in adhesive 120 are formed before flexible layer 122 is bonded to rigid core portion 100.

Preferably, adhesive 120 comprise b-staged (uncured) material similar to that used in the rigid insulating layer, such as, for example, glass reinforced epoxy materials. Upon reading the teachings of this specification, those with ordinary skill in the art will now understand that, under appropriate circumstances, considering issues such as flexible layer 122 material, production cost, etc., other adhesive arrangements may suffice, such as, for example, tri-functional and multifunctional epoxy resin systems, reinforced (such as, for example, with fiber glass fabric) or non reinforced materials, aramid fibers, cast coated epoxy, polyimide resin systems, thermo set and thermoplastic film adhesives (for example, on release film carriers), acrylics, polyesters, phenolic butyral adhesives, and polyimides made up of polyamic acids or esters, epoxy mixed resins with cyanate ester and or polyolefin adders, etc. Preferably, adhesive performs as "no-flow" to avoid filling in gaps 132. Upon reading the teachings of this specification, those with ordinary skill in the art will now understand that, under appropriate circumstances, considering issues such as flexible layer 122 material, whether gaps 132 are created by selective application and/or selective removal of adhesive, etc., other adhesive arrangements may suffice, such as, for example, adhesive that is "restricted flow" or "normal flow".

Figure 6:
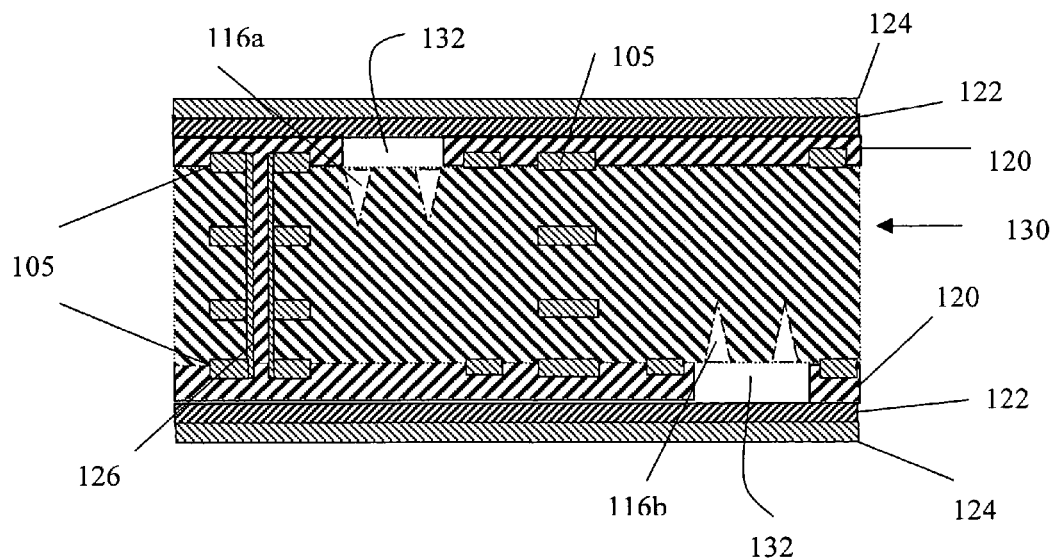
FIG. 6 shows a cross-section side view of the rigid core portion of FIG. 5 after flexible layers have been attached (called rigid flex now that flexible layers have been attached).

FIG. 6 shows a side view of a rigid core portion 100 to which flexible layers 122 have been bonded, comprising rigid flex 130. Preferably, flexible layers 122 are laminated to rigid core portion 100 in a flat platen lamination press under heat and pressure for a duration of time to cure adhesive 120. Preferably, some of adhesive 120 penetrates hole 134 during the lamination process resulting in adhesive filled hole 126, as shown. Upon reading the teachings of this specification, those with ordinary skill in the art will now understand that, under appropriate circumstances, considering issues such as flexible layer 122 material, rigid core portion 100 material, type of adhesive, etc., other lamination arrangements may suffice, such as, for example, curing without increased levels of heat and/or pressure, chemical curing, other methods of curing adhesive, roller presses instead of flat platen presses, etc.

Preferably, flexible layers 122 comprise at least one conductive layer 124, as shown. Preferably, at least one conductive layer 124 is the outermost layer, as shown. Preferably, flexible layers 122 comprise polyimide. Upon reading the teachings of this specification, those with ordinary skill in the art will now understand that, under appropriate circumstances, considering issues such as rigid core portion 100 material, type of adhesive, amount of flexibility required, anticipated number of flex cycles (i.e. flex to install versus continuous flex), etc., other flexible layer arrangements may suffice, such as, for example, using epoxy films, mylar or polyester films, poly-ethylene naphtalate (PEN) films, liquid crystal polymer (LCP) films, some thin aramid fiber woven and non-woven and thin Teflon or FEP (fluorinated ethylene propylene) copper clad films, (to achieve lower cost for limited flexibility applications with fewer than 50 flexing cycles thin epoxy glass reinforced copper clad material may suffice), etc.

Preferably, rigid flex 130 at the stage of manufacture shown in FIG. 6 is still completely rigid (structurally weakened locations have not been broken). Thus, rigid flex 130 at this stage of manufacture has the dimensional stability advantages of normal rigid printed circuit boards.

Figure 7:
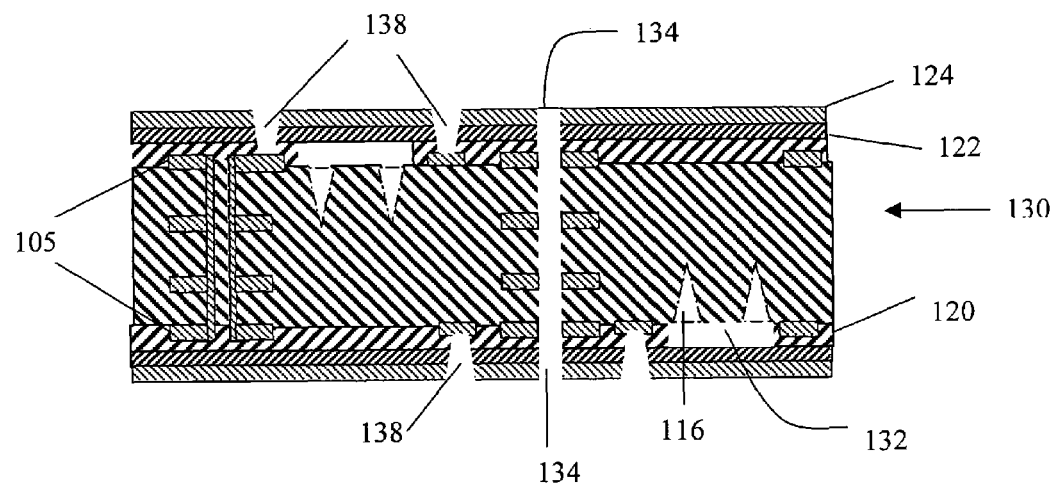
FIG. 7 shows a cross-section side view of the rigid flex of FIG. 6 after it has been drilled.

FIG. 7 shows a side view of rigid flex 130 that has been drilled. Preferably, conductive layers 104 and conductive layers 110 from rigid core portion 100 and conductive layers 124 from flexible layers 122 are interconnected (forming electrical connections) at locations by drilling holes 134 (and holes 138) through portions of rigid flex 130, as shown. Preferably, holes 134 (and holes 138) are drilled to between pads 105 on different conductive layers (conductive layers 104, conductive layers 110, and conductive layers 124) of rigid flex 130. Preferably holes 134 (and holes 138) are mechanically drilled, laser drilled, plasma or chemically drilled. Holes 134 may be drilled completely through rigid flex 130, as shown, or may only extend partially through rigid flex 130. Holes 138 may be drilled completely through rigid flex 130, or may only extend partially through rigid flex 130, as shown.

Figure 7A:
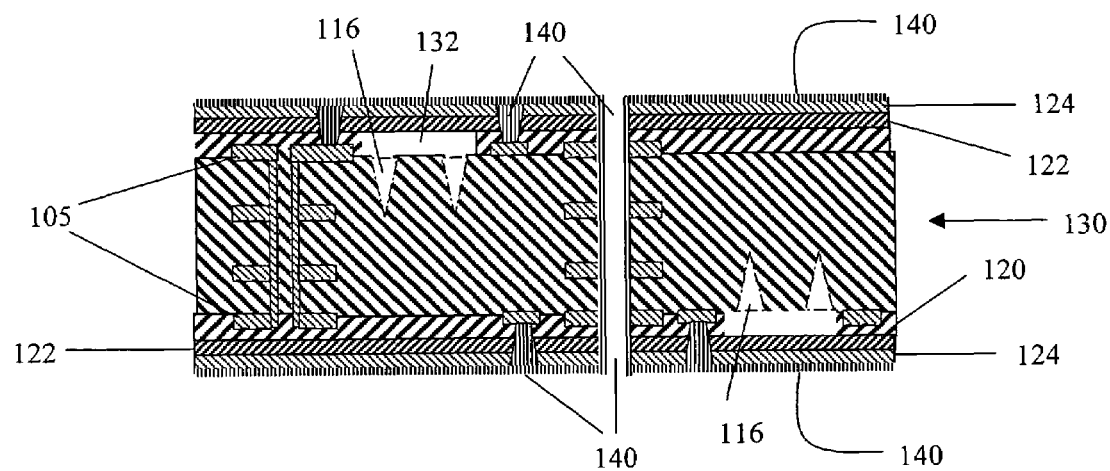
FIG. 7a shows a cross-section side view of the rigid flex of FIG. 7 after conductive material has been applied.

FIG. 7a shows a side view of rigid flex 130 after conductive material 140 has been applied. Preferably, holes 134, holes 138, and conductive layer 124 are cleaned and prepared before conductive material 140 is applied. Preferably, conductive material 140 is applied to holes 134, holes 138, and conductive layer 124 to form electrical connections between pads 105 on different conductive layers (preferably using the same materials and processes described above in applying conductive material 114).

Figure 7B:
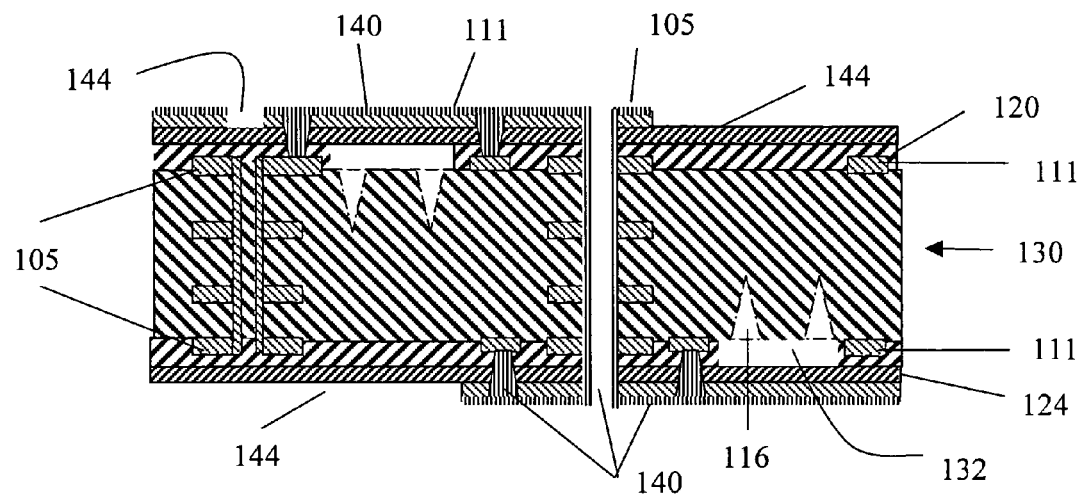
FIG. 7b shows a cross-section side view of the rigid flex of FIG. 7a after portions of conductive material have been etched away.

FIG. 7b shows a side view of rigid flex 130 after portions of conductive material 140 have been removed. Preferably, conductive material 140 and conductive layer 124 are processed (such as, for example, plated, printed and etched, or printed, plated and etched, etc., preferably using the methods described above in processing conductive layer 104) to form traces 111, pads 105, and gaps 144, etc., on the outer surface of rigid flex 130, as shown. Additional flexible layers can be added by repeating this process of laminating flexible materials, drilling, plating, printing and etching of conductive patterns of pads and traces.

Figure 8:
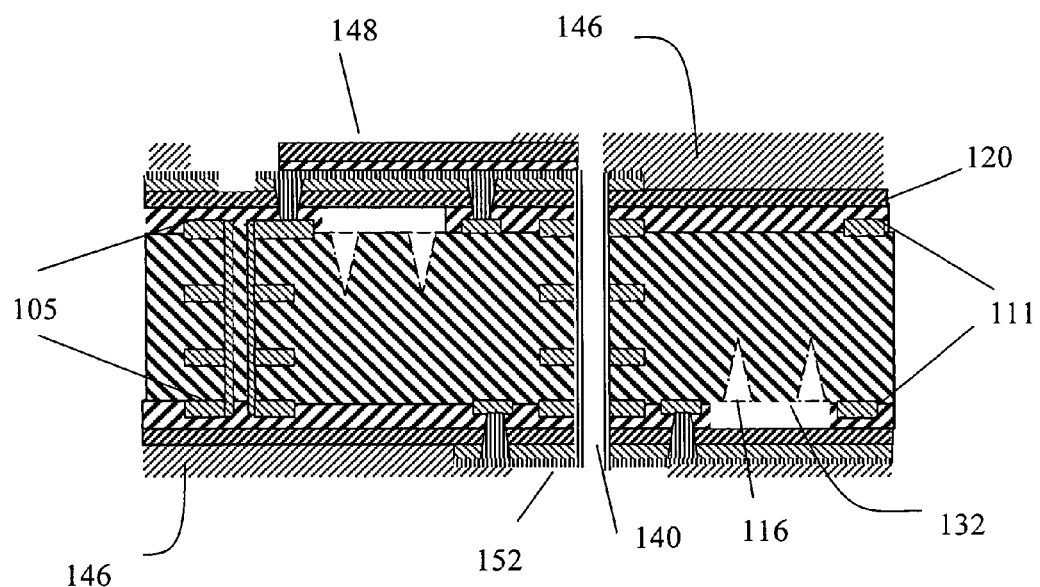
FIG. 8 shows a cross-section side view of the rigid flex of FIG. 7b after solder mask has been applied.

FIG. 8 shows a side view of rigid flex 130 after solder mask has been applied. Preferably, flexible solder mask 146 is applied in locations where flexure will occur, as shown. Preferably, cover sheet 148 comprises flexible dielectric and adhesive layer bonded to rigid flex 130, as shown. Preferably, cover sheet 148 comprises a flexible dielectric layer and a flexible adhesive layer. Preferably, portions of cover sheet 148 and flexible solder mask 146 comprise openings 152 to allow electrical components and hardware items to be attached, as shown (see FIG. 10). Upon reading the teachings of this specification, those with ordinary skill in the art will now understand that, under appropriate circumstances, considering issues such as production cost, material properties of solder mask, etc., other solder mask arrangements may suffice, such as, for example, applying non-flexible solder mask in areas where flexure will not occur, using other materials for solder mask, etc.

Figure 9:
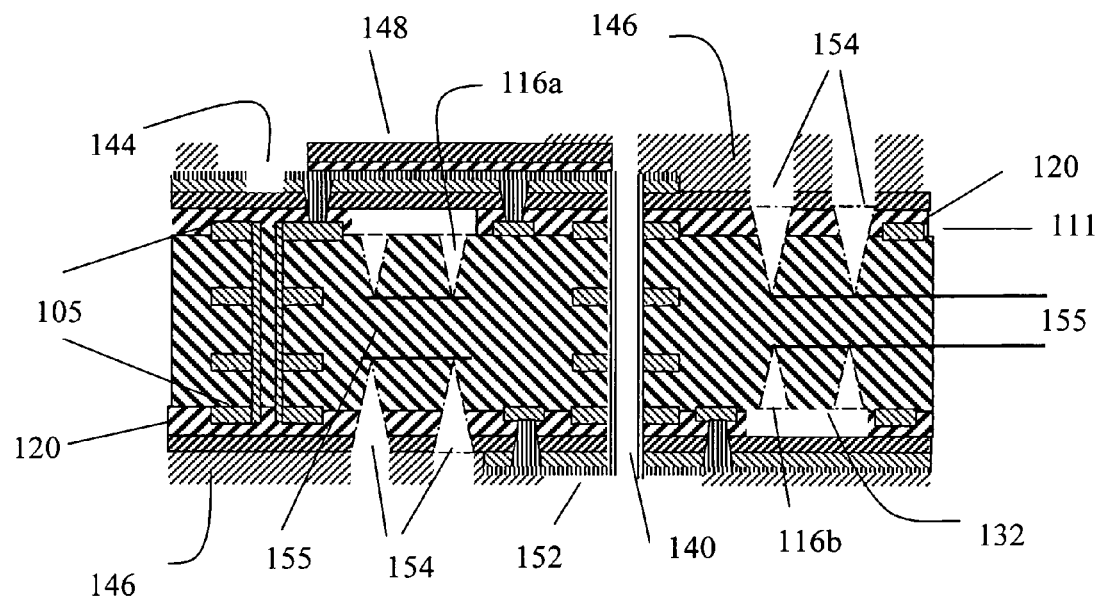
FIG. 9 shows a cross-section side view of the rigid flex of FIG. 8 which has been further structurally weakened at selected locations.

FIG. 9 shows a side view of rigid flex 130 which has been further structurally weakened at selected locations. Preferably, portions of flexible layers 122, cover sheet 148 and flexible solder mask 146 are selectively removed to form final structural weaknesses 154, preferably coinciding with the locations of rigid core weaknesses 116, as shown. Preferably, top rigid core weaknesses 116a are created opposite where bottom rigid core weaknesses 116b are located (and vice-versa), as shown. Preferably, final structural weaknesses 154 are located on the side of rigid flex 130 that will be convex when the rigid flex 130 is broken and flexed at the structurally weakened portion 155, as shown. Preferably, at least one flexible layer 122 bridges the structurally weakened portion 155 on the side of rigid flex 130 that will be concave when the rigid flex 130 is broken and flexed at the structurally weakened portion 155, as shown. Preferably, final structural weaknesses 154, top rigid core weaknesses 116a, and bottom rigid core weaknesses 116b are created by removing material (including flex and rigid material), preferably using the methods described above for creating rigid core weaknesses 116 (for example, by mechanically scoring), as shown.

Score depth control is important in creating rigid core weaknesses 116 and final structural weaknesses 154. Preferably, the total depth of rigid core weaknesses 116 (top rigid core weaknesses 116a plus bottom rigid core weaknesses 116b) at a location should be about two thirds of the total thickness of rigid core portion 100, preferably one top rigid core weakness 116a with a depth about one third of the total thickness of rigid core portion 100, and one bottom rigid core weaknesses 116b with a depth about one third, as shown. Preferably, the thickness of remaining weakened portion 155 should be about one third of the total thickness of rigid core portion 100 (preferably remaining weakened portion 155 is of sufficient thickness to prevent or minimize accidental breakage of rigid core portion 100 before the intended time, and yet still allow for controlled and efficient breakage of rigid core portion 100 at the intended time). Preferably, final structural weaknesses 154 are created after flexible layers are laminated to the rigid core portion 100 (preferably, as the last step, such as, for example, after assembly of electric components). Upon reading the teachings of this specification, those with ordinary skill in the art will now understand that, under appropriate circumstances, considering issues such as dimensions and materials of rigid core portion, available machinery, production cost, quality control, etc., other structural weakening arrangements may suffice, such as, for example, laser routing and/or mechanical machining and/or plasma machining and/or mechanically impacting, structurally weakening without removing material, using different ratios for depth of material removal and remaining weakened portion 155, structurally weakening (and/or removing material from) only one side of rigid core portion 100 instead of both sides, and or structurally weakening (and/or removing material from) only one side of rigid flex 130 instead of both sides, etc.

Laser scoring may be used to provide very accurate depth control for structural weakening (especially useful for thinner boards). For example, for a 0.008 inch thick rigid core portion 100 a laser may be used to make the top rigid core weakness 116a about 0.002 inches, and a laser may be used to make the bottom rigid core weakness 116b about 0.002 inches, leaving the remaining weakened portion 155 to be about 0.004 inches. Laser stop pads 168 may be used to assist in controlling the depth of the cut 167 (see FIG. 14.). Preferably, laser stop pads 168 comprise metal.

Figure 10:
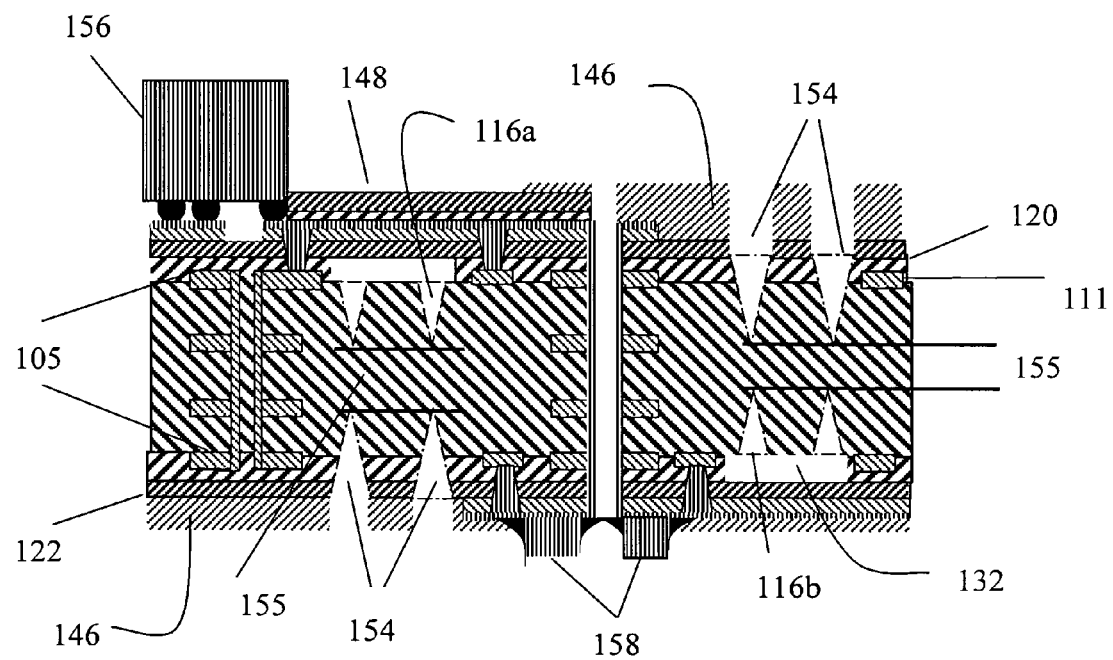
FIG. 10 shows a cross-section side view of the rigid flex of FIG. 9 after electrical components and hardware items have been attached.

FIG. 10 shows a side view of rigid flex 130 after electrical components 156 and hardware items 158 have been attached. Preferably rigid flex 130 comprises electrical components 156 and hardware items 158, as shown. Preferably, flexible solder mask 146 and cover sheet mask 148 comprise openings at selected locations to allow access to pads 105 and traces 111, etc. (for mounting electrical components 156 and hardware items 158, etc., such as, for example, computer chips, resistors, capacitors, wires, etc.), as shown.

Figure 11A:
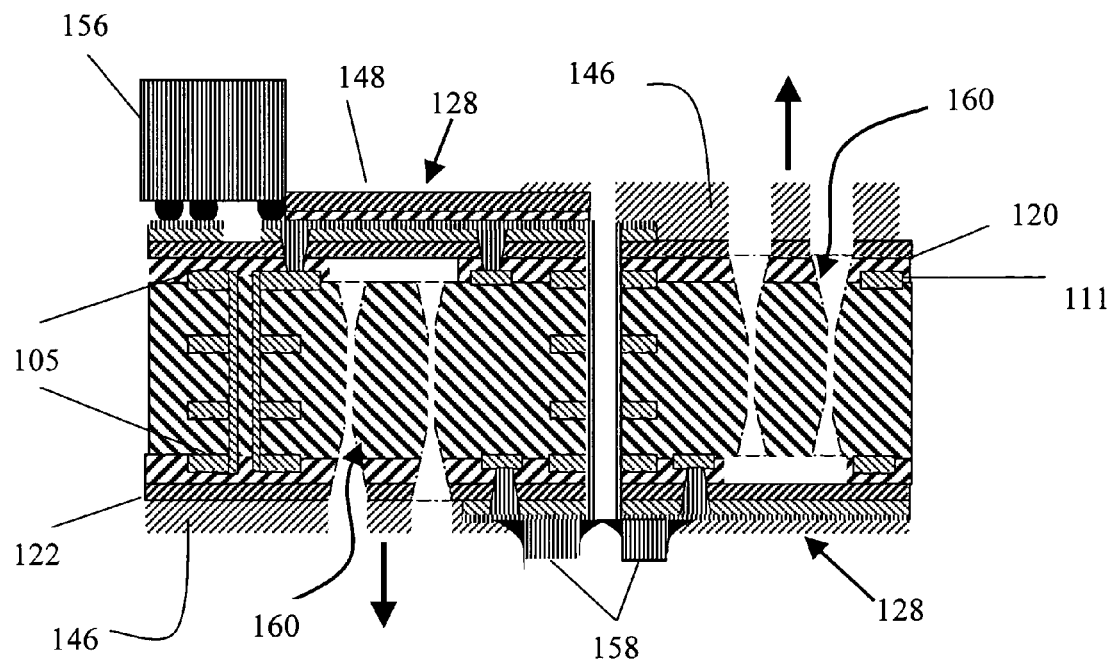
FIG. 11a shows a cross-section side view of the rigid flex of FIG. 10 that is ready to be broken and flexed.
Figure 11B:
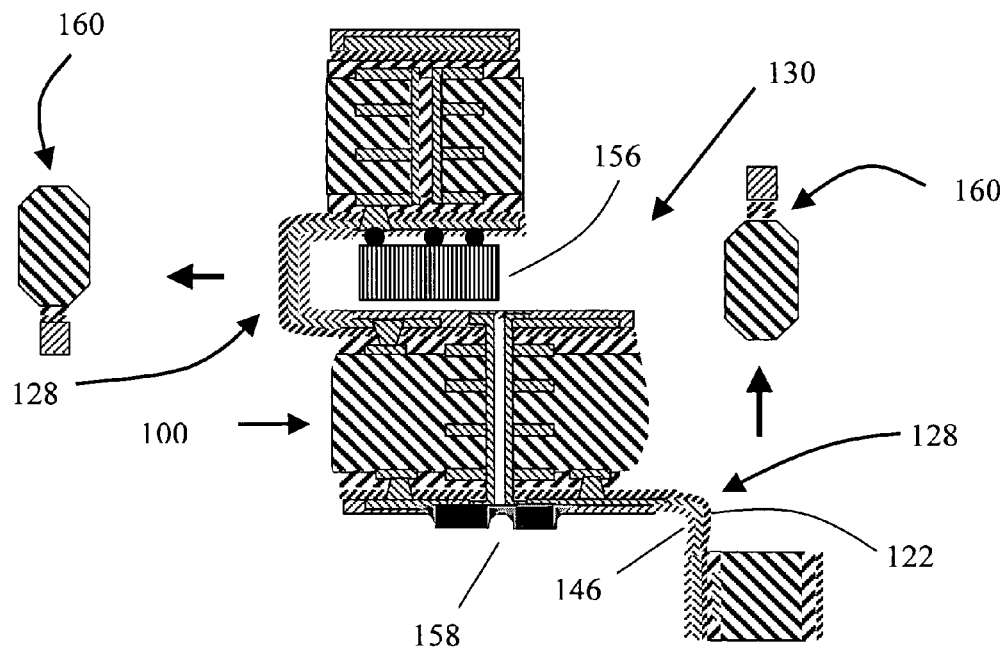
FIG. 11b shows a cross-section side view of the rigid flex of FIG. 11a that has been broken and is being flexed.

FIG. 11a shows a side view of rigid flex 130 that is ready to be broken and flexed. FIG. 11a shows a side view of rigid flex 130 that has been broken and is being flexed. When rigid core portion 100 is broken at a location of a rigid core weakness 116 a breakaway portion 160 may detach, as shown. Rigid core portion 100 may also be broken without detaching a breakaway portion 160. Preferably, rigid core portion 100 is broken by flexing rigid core portion 100 so that the side on which flexible layers 122 will form a flexible connection 128 is concave, as shown. For example, if the flexible connection 128 will be on top, the rigid core portion is flexed (so that the rigid core portion is concave in the upward direction) until the rigid core portion is broken at the location of rigid core weakness 116, as shown. After rigid core portion 100 is broken at the location of rigid core weakness 116, flexible layers 122 form a flexible electrical connection, bridging the pieces of the rigid core portion 100 on either side of such location, as shown.

Figure 12A:
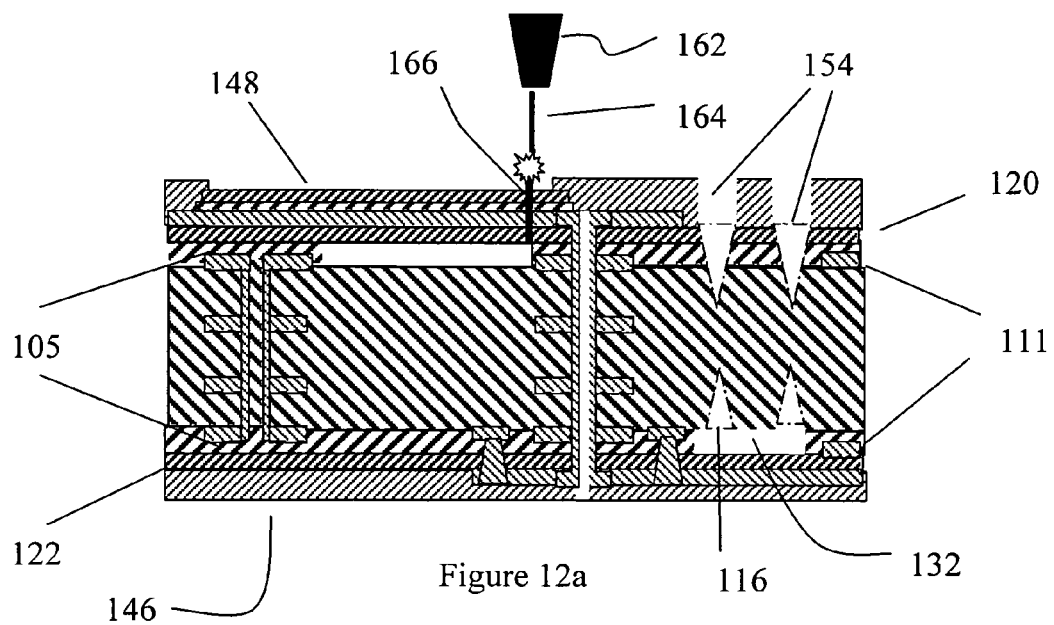
FIG. 12a shows a cross-section side view of rigid flex that is being laser drilled to create a 3-dimensional flexible circuit, according to an alternate preferred embodiment of the present invention.
Figure 12B:
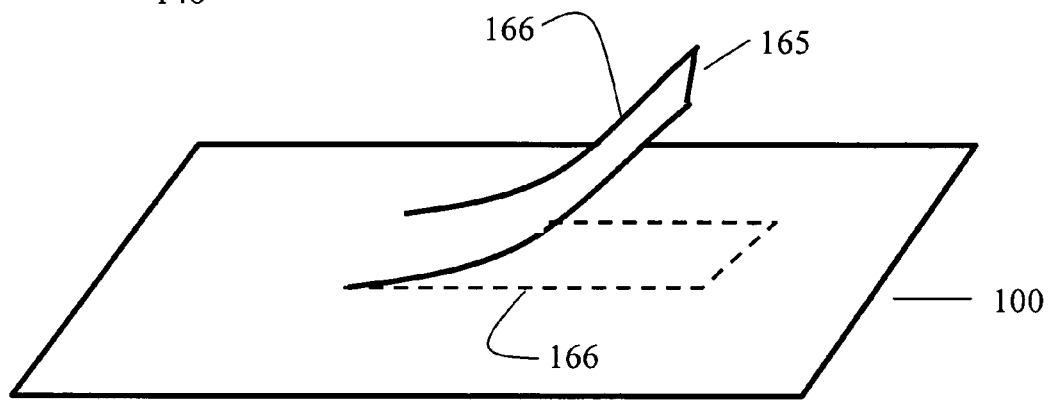
FIG. 12b shows a perspective view of rigid flex showing a 3-dimensional flexible circuit that has been peeled away from the rigid core portion, according to an alternate preferred embodiment of the present invention.

FIG. 12 shows a side view of rigid flex 130 that is being laser drilled, according to an alternate preferred embodiment of the present invention. Preferably gap 132 is created in adhesive 120 underneath a portion of flexible layers 122 (preferably over a portion of rigid core portion 100 that has not been structurally weakened), as shown. Preferably partial perimeter 166 is cut from flexible layers 122, as shown. Preferably flexible layers are cut with a laser beam 164 from a laser drill 162, as shown. Upon reading the teachings of this specification, those with ordinary skill in the art will now understand that, under appropriate circumstances, considering issues such as material composition of flexible layers 122, flexible solder mask 146 and cover sheet masks 148, etc., available machinery, production cost, quality control, etc., other cutting arrangements may suffice, such as, for example, mechanical cutting means, routing, mechanical machining, punching, impacting, mechanical abrasion, etc.

Figure 13:
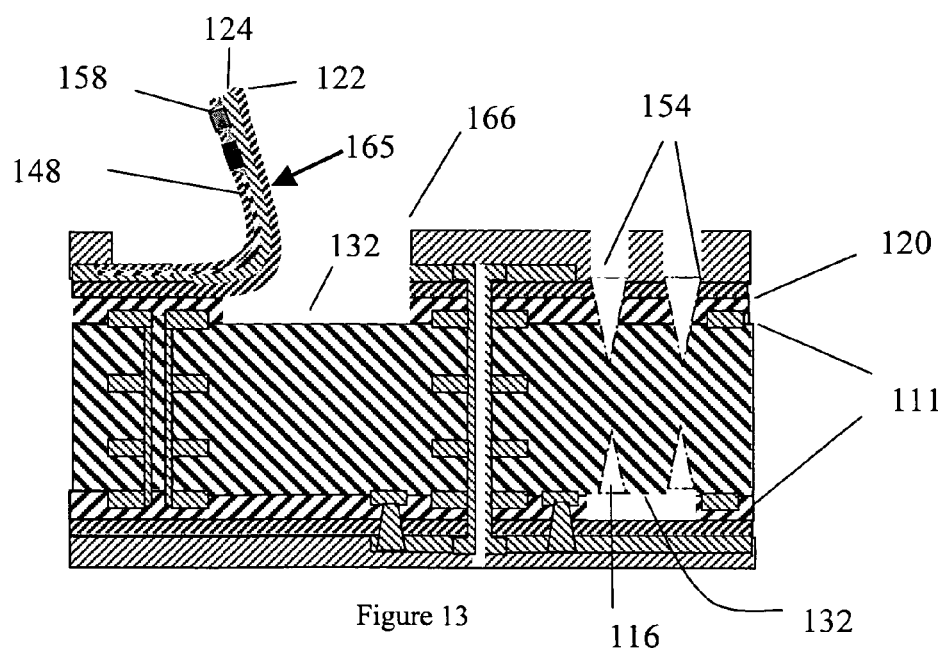
FIG. 13 shows a cross-section side view of the rigid flex of FIG. 12b with a 3-dimensional flex circuit peeled away from rigid core portion.

FIG. 13 shows a side view of rigid flex 130 with 3-dimensional flex circuit 165 peeled away from rigid core portion 100. Preferably, after partial perimeter 166 is cut, 3-dimensional flex circuit 165 is peeled away from rigid core portion, as shown in FIG. 13. 3-dimensional flex circuit 165 can be cut and peeled away from rigid core portion 100 before or after final component assembly.

Figure 14:
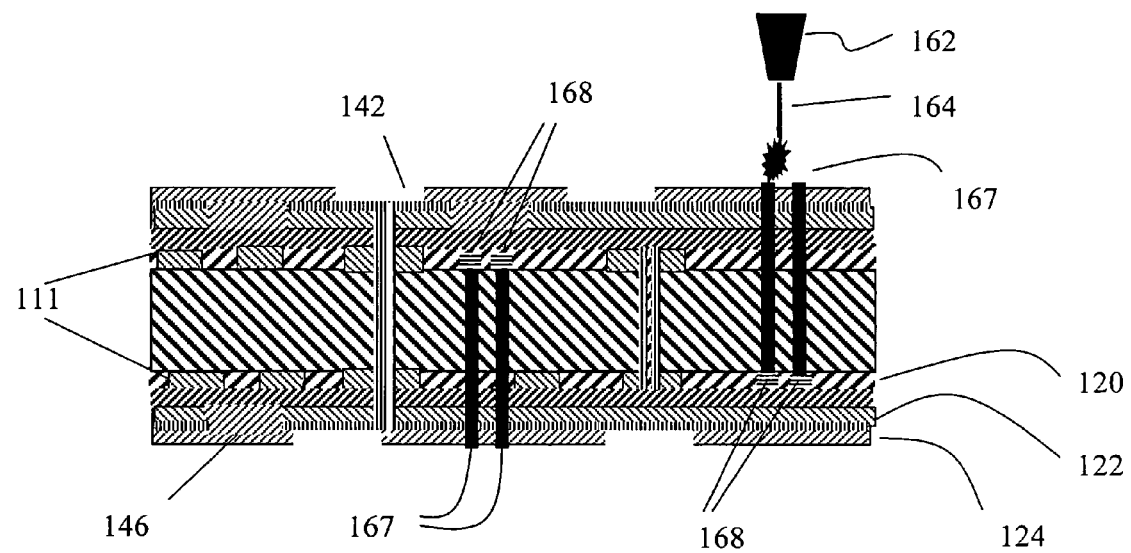
FIG. 14 shows a cross-section side view of rigid flex being laser drilled according to an alternate preferred embodiment.

FIG. 14 shows a side view of rigid flex 130 according to an alternate preferred embodiment. Preferably, laser stop pads 168 are embedded within rigid flex 130. Preferably, laser stop pads 168 are embedded on the same side of rigid core portion 100 as the flexible layers 122 which will form the flexible connection, as shown. Preferably, laser beam 164 from laser drill 162 cuts through rigid flex 130 (from the opposite side from which laser stop pad 168 is located) to laser stop pad 168, resulting in cut 167, as shown. Preferably, cut 167 extends completely through rigid core portion 100, as shown. Cut 167 may also extend only partially through rigid core portion 100 thus comprising a structural weakness in rigid core portion 100 so that rigid core portion 100 may be efficiently broken later (to create a flexible connection at such location). Depending on the number of (preferably parallel) cuts 167 (two cuts are shown at each of the two locations shown in FIG. 14), rigid flex 130 can be flexed with different radiuses. Increasing the number of cuts 167 may increase the bend radius and may also increase the flexibility of the connection.

Figure 15:
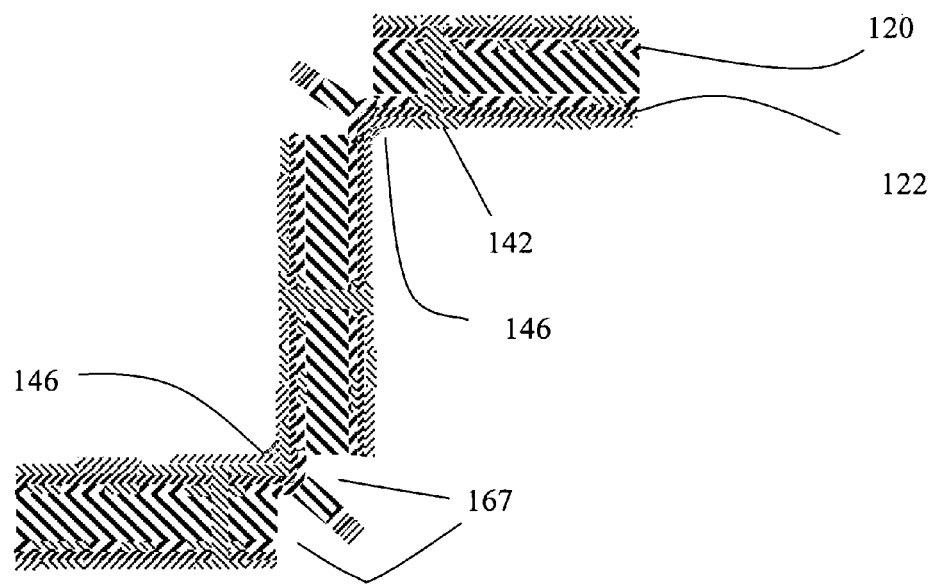
FIG. 15 shows a cross-section side view of the rigid flex of FIG. 14 being flexed.

FIG. 15 shows rigid flex 130 of FIG. 14 in a flexed position. Preferably, rigid flex 130 as shown in FIG. 14 and 15 is suitable for "static flex" or "flex for installation only."

Figure 16A:
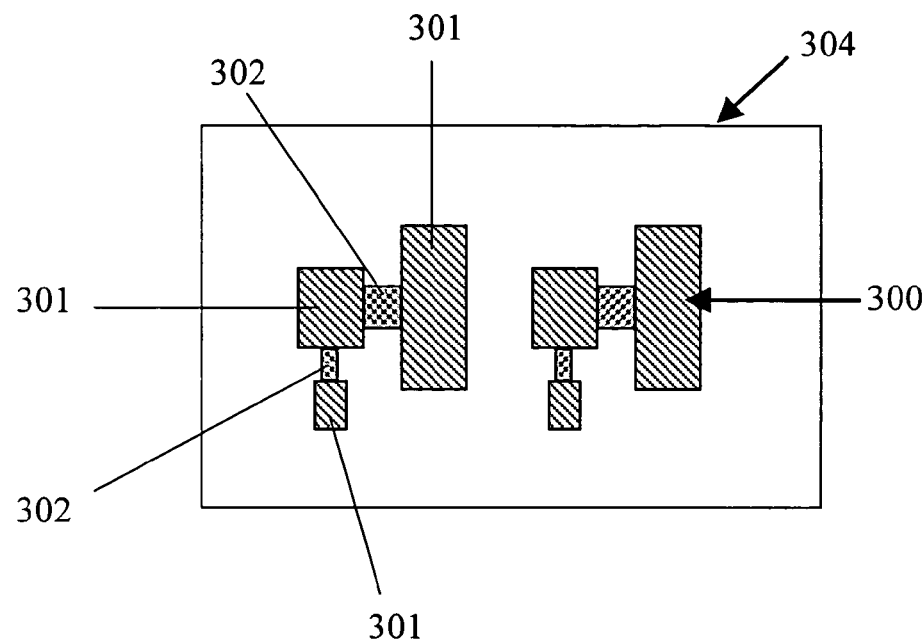
FIG. 16a shows a top view of a small panel used to manufacture rigid flex circuit boards.

FIG. 16a shows a top view of a rigid flex unit 300 comprised of rigid portions 301 and flexible portions 302. In the past, production of rigid flex units 300 has been limited to small manufacturing panels 304 since traditional flex portions 302 (which can bend, flex, and stretch etc., during the manufacturing process) limit the ability to efficiently and effectively manufacture rigid flex units 300 on larger panels. For example, the greater the number of flexible portions 302 per unit the more difficult it is to manipulate and control the rigid flex unit 300. Increased difficulty in handling and manipulation (such as from bending, flexing and stretching etc., during the manufacturing processes) result in higher cost and higher scrap rates, etc. Thus, in the past the ability to manufacture and process multiple units on larger panels has not been effective. Further, the size and complexity (for example, the number of flexible portions) has had to be minimized in order to reduce the undesirable effects of the flexible portions. Preferably the flexible layers are located on the outer layers of the rigid support circuit board, which allows a build-up method of manufacturing the rigid flex. Preferably, the flexible layers are attached and processed on the outer layer rigid support mechanism. Processing the flexible layers (printing, plating and etching, etc.) and then sandwiching them in the middle of other layers would cause manufacturing complications due to the need to register connections between layers during lamination (dimensional instability before and after each lamination step would negatively impact process yields). Processing the flexible material on the outer layers allows utilization of the flexible outer layer as a high density interconnect layer thus using the latest laser drill technology to produce smaller holes and finer conductive features. This method also allows the manufacturer to use various materials that are significantly thinner overall. This method of laminating the thinnest dielectrics and the thinnest metalization flex layers on the outside support rigid circuit board allow for newer and more advanced electronic applications such as continuous flexing applications as seen in printer heads, flip cell phones, DVD players, disk drives, cameras, high-density applications for flip chip, and direct chip attachment methods for microelectronic assemblies etc.

Figure 16B:
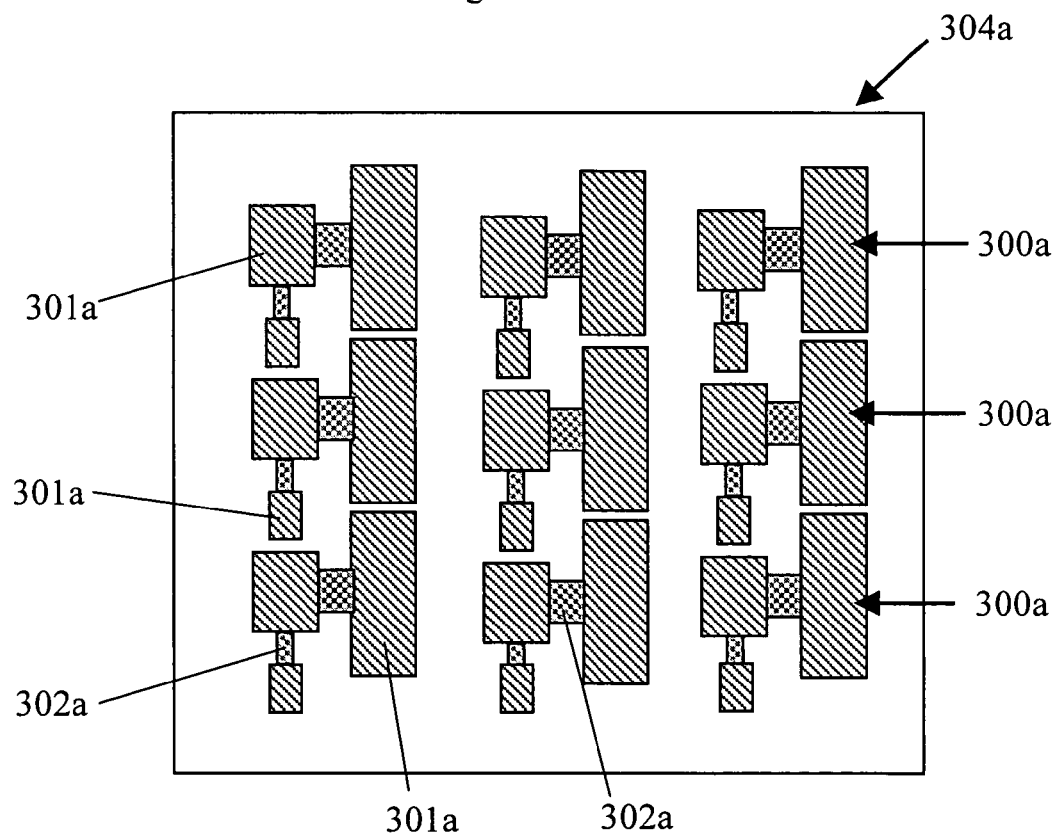
FIG. 16b shows a top view of a large panel used to manufacture multiple rigid flex boards, according to a preferred embodiment of the present invention.

FIG. 16*b* shows a top view of multiple rigid flex units 300*a*, each comprised of rigid portions 301*a* and flexible portions 302*a*, being manufactured on a large manufacturing panel 304*a*. Since, flexible portions 302*a* are rigid throughout the manufacturing process (until it is desired for them to become flexible, such as by breaking the rigid core at selected structurally weakened locations) the undesirable effects of bending, flexing and stretching etc., are avoided during the manufacturing process. As a result, the number of flexible portions 302*a* is not a limiting factor, neither is the size of rigid flex unit 300*a*. In fact, whereas in the past, manufacturing a rigid flex unit 300 has been limited to smaller sized panels, now, given the teachings herein, a rigid flex unit 300*a* can be manufactured in any size as if it were a completely rigid board (since it is a completely rigid board until the structurally weakened portions are broken). Preferably, multiple rigid flex units 300*a* are produced on larger manufacturing panels 304*a* (and then cut apart) in order to take advantage of increased efficiencies from larger scale manufacturing.

Figure 17A:
FIG. 17a shows a side view of a rigid core portion of a rigid-flex circuit board according to a preferred embodiment of the present invention.

FIG. 17*a* shows a side view of a rigid core portion 180' of a rigid-flex circuit board according to a preferred embodiment of the present invention. Preferably rigid core portion 180' comprises a metal core, preferably copper or aluminum, as shown. Upon reading the teachings of this specification, those with ordinary skill in the art will now understand that, under appropriate circumstances, considering issues such as intended use, production cost, etc., other rigid core material arrangements may suffice, such as, for example, other metals, copper, copper alloys, aluminum alloys, stainless alloys, etc.

Figure 17B:
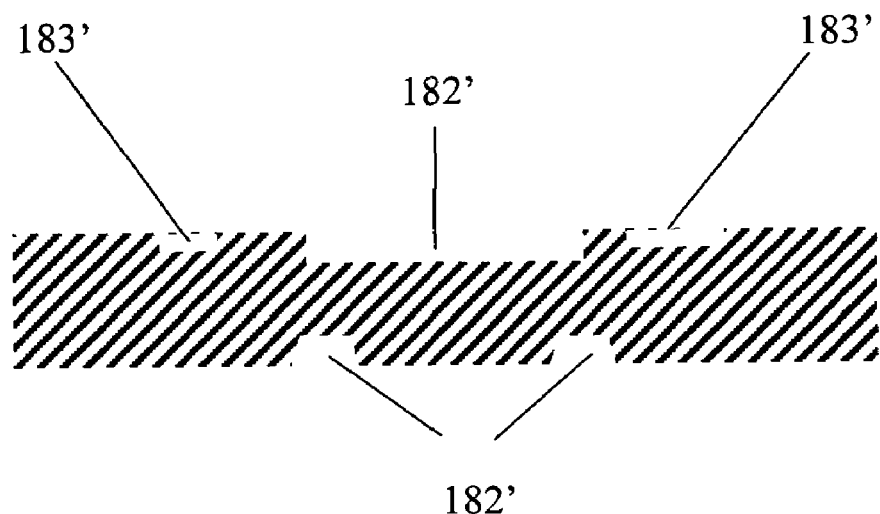
FIG. 17b shows a side view of the rigid core portion of FIG. 17a after it has been structurally weakened.

FIG. 17*b* shows a side view of the rigid core portion 180' of FIG. 17*a* after it has been structurally weakened. Preferably, structurally weakened locations 182' are created by removing material from rigid core portion 180' at selected locations, as shown. Preferably, structurally weakened areas have a weaker cross sectional strength than non-weakened areas. Preferably, structurally weakened locations 182' comprise grooves, as shown. Preferably, the chemical etching process comprises applying a suitable photo resist and projecting an image, developing the photo resist away and chemically etching a pattern using a system of FeCl (Ferric chloride) etching solution, or other means to remove a pattern of material from the metal plate to form structurally weakened locations 182'. Chemical etching may be suitable for fast and accurate relief patterning and also may provide a pre-etched pattern for the final outer layer circuitry, allowing for finer pattern etching from the backside of the circuit pattern. Preferably, locations for embedded components 183' are created by removing material from rigid core portion 180' at selected locations, as shown. Preferably, structurally weakened locations 182' and locations for embedded components 183' are created by etching away selected portions of rigid core portion 180', as shown. Upon reading the teachings of this specification, those with ordinary skill in the art will now understand that, under appropriate circumstances, considering issues such as dimensions and materials of rigid core portion, available machinery, production cost, quality control, etc., other structural weakening arrangements may suffice, such as, for example, laser routing, laser drilling, mechanical machining, plasma machining, structurally weakening without removing material, other etching methods, using mechanical routing, mechanically impacting, die punching, other abrading or impact means, etc.

Figure 17C:
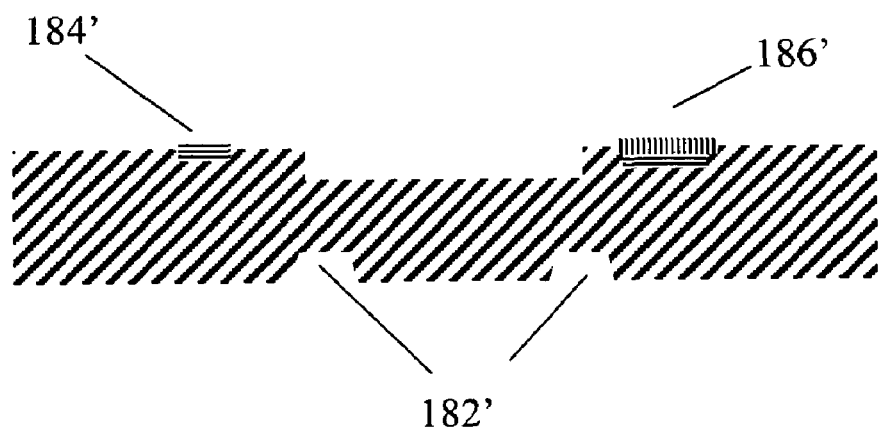
FIG. 17c shows a side view of the rigid core portion of FIG. 17b after embedded electrical components have been added.

FIG. 17*c* shows a side view of rigid core portion 180' of after embedded electrical components have been added. Preferably, embedded electrical components such as screen or stencil printed embedded resistor material 184' and screen or stencil printed embedded capacitor material 186' are placed on rigid core portion 180', preferably at locations for embedded components 183', as shown. Locations for embedded components 183' assist in providing for a more predictable or more precise amount of screen/stencil printed embedded resistor material 184' and screen/stencil printed embedded capacitor material 186' to be placed. Preferably, screen/stencil printed embedded resistor material 184' and screen/stencil printed embedded capacitor material 186' are screen printed or lift off stencil printed and cured with standard thick film semi-conductive resistive materials and or standard thick film capacitive materials.

Preferably screen/stencil printed embedded resistor material 184' and screen/stencil printed embedded capacitor material 186' are polymer based or ceramic based as used in (LTCC) process "Low temperature co-fired ceramic" processing. Copper and stainless foils and their alloys are suited for the high temperature baking or firing process for both polymer and ceramic base materials. Aluminum metal cores and their alloys are typically suited for polymer base materials that cure by baking at or below four hundred degrees F.

Figure 17D:
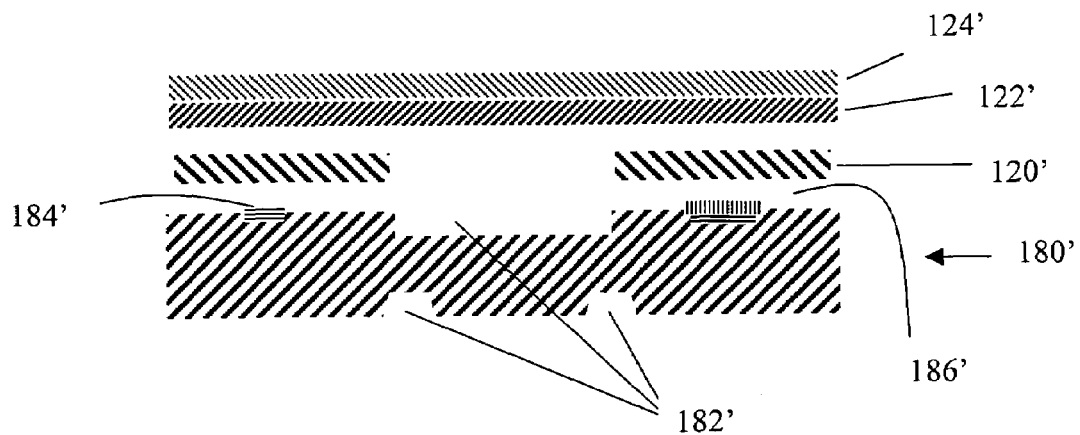
FIG. 17d shows a side view of the rigid core portion of FIG. 17c with flexible layers about to be attached (called rigid flex now that flexible layers have been attached).

FIG. 17*d* shows a side view of rigid core portion 180' with flexible layers about to be attached. Preferably, flexible layers 122' comprise at least one conductive layer 124', as shown. Preferably, at least one conductive layer 124' is the outermost layer, as shown. Preferably, flexible layers 122' comprise polyimide. Preferably flexible layers 122' are bonded to rigid core portion 180' with adhesive 120'. Preferably, adhesive 120' comprises polyimide. Preferably, adhesive 120' is selectively applied to rigid core portion 180' leaving gaps 132' at structurally weakened locations 182', as shown. Under appropriate circumstances, other arrangements may suffice, such as, for example, the arrangements described above for adhesive 120, flexible layers 122, conductive layer 124, gaps 132, etc.

Figure 17E:
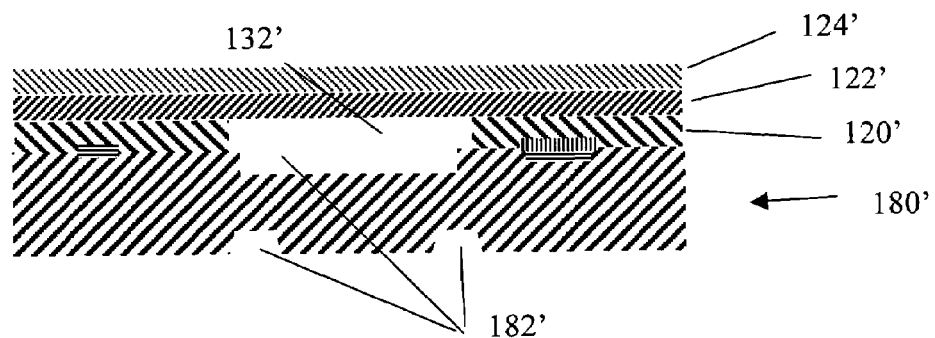
FIG. 17e shows a side view of the rigid flex of FIG. 17d after flexible layers have been attached.

FIG. 17e shows a side view of rigid core portion 180' after adhesive 120' (with adhesive gaps 132'), flexible insulating layers 122' and flexible conductive layer 124', have been attached.

Figure 17F:
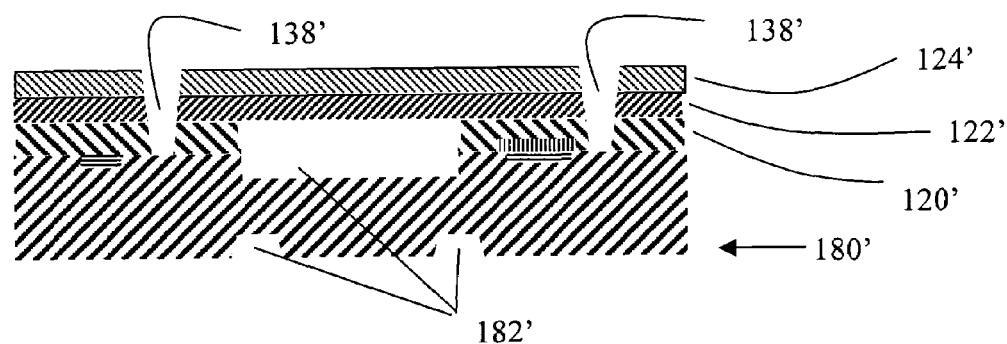
FIG. 17f shows a side view of the rigid flex of FIG. 17e after holes have been drilled through flexible layers.

FIG. 17f shows a side view of rigid core portion 180' after holes 138' have been drilled. Preferably holes 13' are drilled as described above for holes 138'. Preferably holes 138' are used to make interconnects between conductive layers, as shown. Preferably, holes 138' and make by the same processes as holes 138.

Figure 17G:
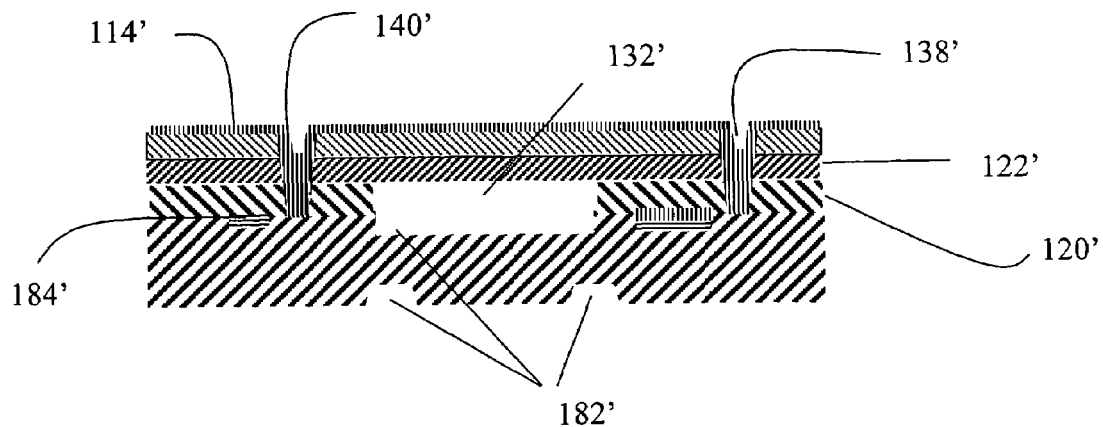
FIG. 17g shows a side view of the rigid flex of FIG. 17f after conductive material is applied.

FIG. 17g shows a side view of rigid core portion 180' after conductive material 140' is applied. Preferably conductive material 140' is applied as described above for conductive material 140.

Figure 17H:
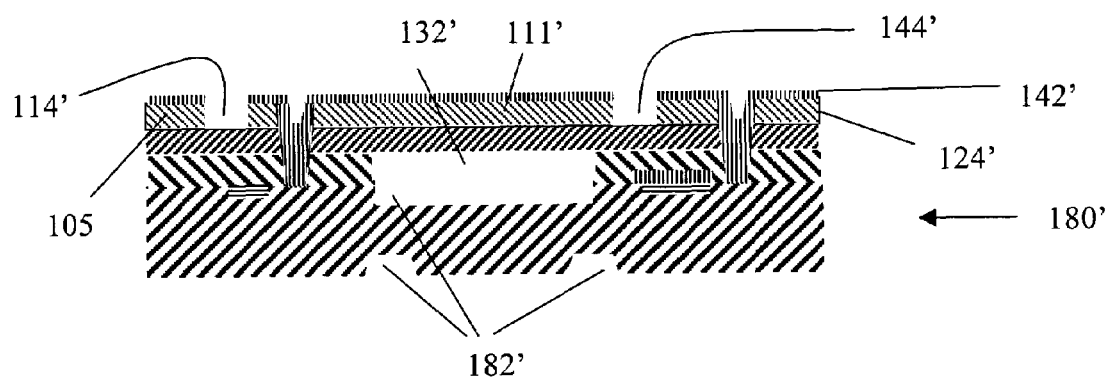
FIG. 17h shows a side view of the rigid flex of FIG. 17g after portions of conductive material are etched away.

FIG. 17h shows a side view of rigid core portion 180' after portions of conductive material 140' are etched away. Preferably conductive material 140' is etched away as described above for conductive material 140.

Figure 17I:
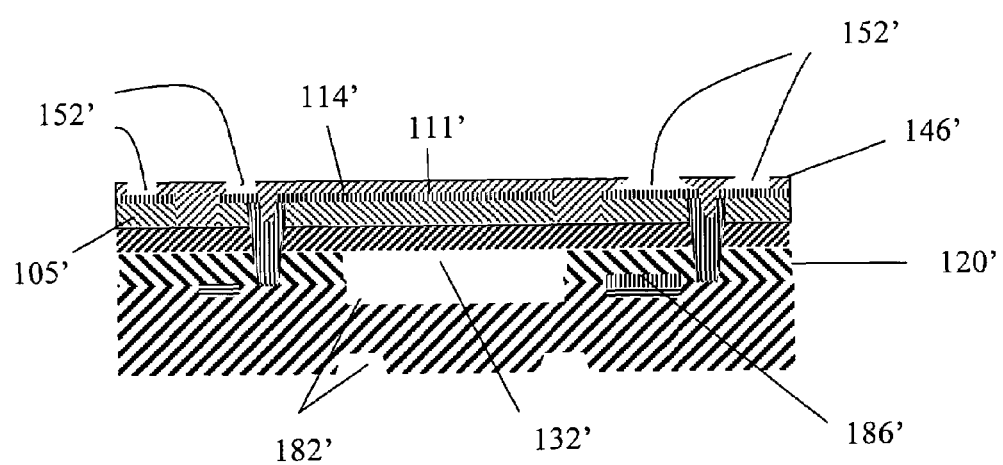
FIG. 17i shows a side view of the rigid flex of FIG. 17h after an insulating layer is applied.

FIG. 17i shows a side view of rigid core portion 180' after flexible solder mask 146' is applied. Preferably, flexible solder mask 146' comprises openings 152' at selected locations to allow access for mounting electrical components 156' and hardware items 158' (see FIG. 17j), etc., (such as, for example, computer chips, resistors, capacitors, wires, etc.) as shown.

Figure 17J:
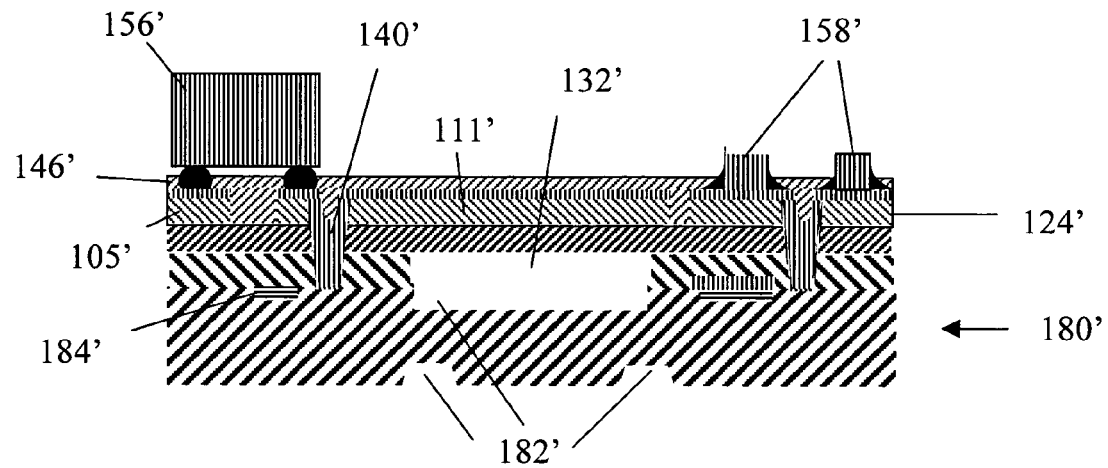
FIG. 17*j* shows a side view of the rigid flex of FIG. 17*i* after electrical components are added.

FIG. 17j shows a side view of rigid core portion 180' after electrical components 156' and hardware items 158' have been attached. Preferably rigid core portion 180' comprises electrical components 156' and hardware items 158', as shown.

Figure 17K:
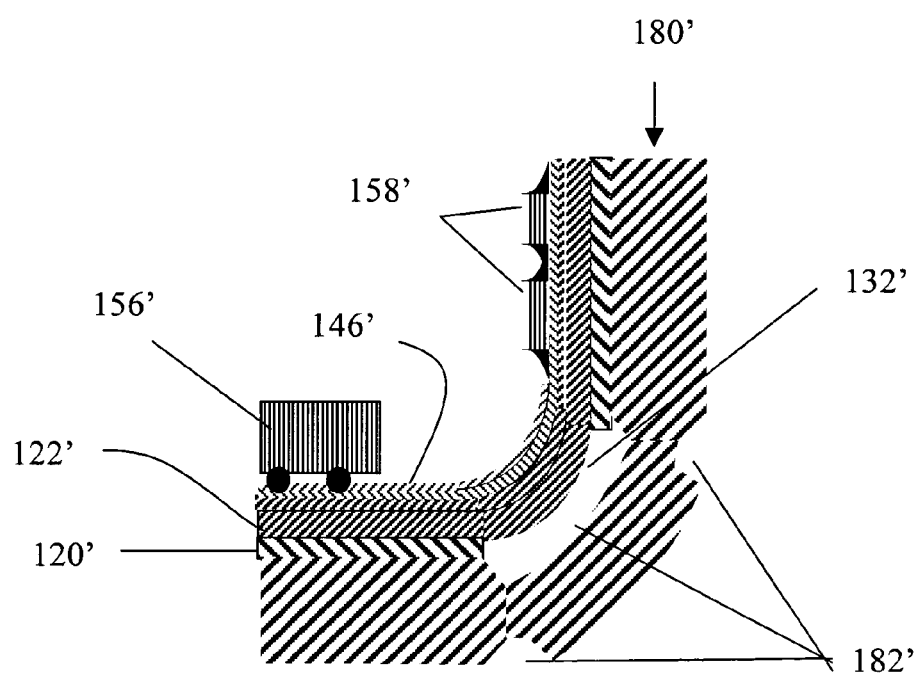
FIG. 17*k* shows a side view of the rigid flex of FIG. 17*j* after rigid flex has been bent.

FIG. 17k shows a side view of rigid core portion 180' after rigid core portion 180' has been bent (such as, for example, for final installation). Rigid core portion 180' may, for example, be bent for installation into a box or self contained metal enclosure or used for many new electronic devices such as self contained and EMI shielded devices. Preferably, rigid core portion 180' is malleable, so that it bends rather than breaks at structurally weakened location 182', as shown. Preferably, gaps 132' and structurally weakened locations 182' (which preferably comprise removed material) allow flexible layers 122' to bend without breaking. Preferably gaps 132' provide the flexible layers 122' a deformation relief area in which to expand. Preferably, during the bending or folding of the rigid core portion 180' the flexible layers 122' will be put into compression, and the relief area created by gaps 132' allow for the compressed forces to bend the flexible layers 122' into the bend relief area, thus relieving the stresses and avoiding any breakage issues, as shown.

Figure 18A:
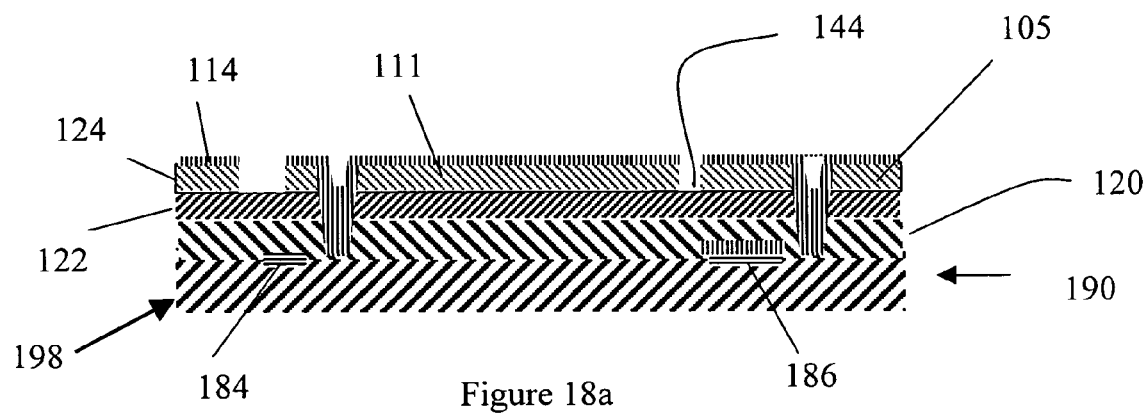
FIG. 18*a* shows a side view of a rigid-flex circuit board according to an alternate preferred embodiment of the present invention.

FIG. 18a shows a side view of rigid-flex circuit board 198 according to an alternate preferred embodiment of the present invention. Preferably, circuit board 198 comprises metal support carrier 190, adhesive 120, flexible layers 122, conductive layer 124, pads 105, traces 111, conductive material 114, gaps 144, etc., (as described above), as shown.

Figure 18B:
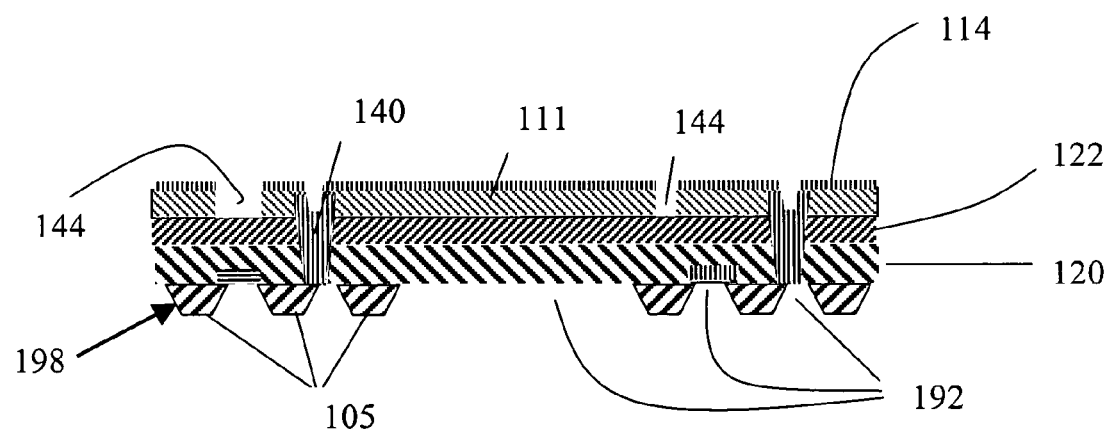
FIG. 18*b* shows a side view of the circuit board of FIG. 18*a* after portions of the rigid carrier have been removed.

FIG. 18b shows a side view of circuit board 198 after portions of metal support carrier 190 have been removed. Preferably, portions of metal support carrier 190 are selectively removed, preferably selectively etched away, as shown, creating gaps 192, providing conductive pads 105, and removing rigidity from circuit board 198.

Figure 18C:
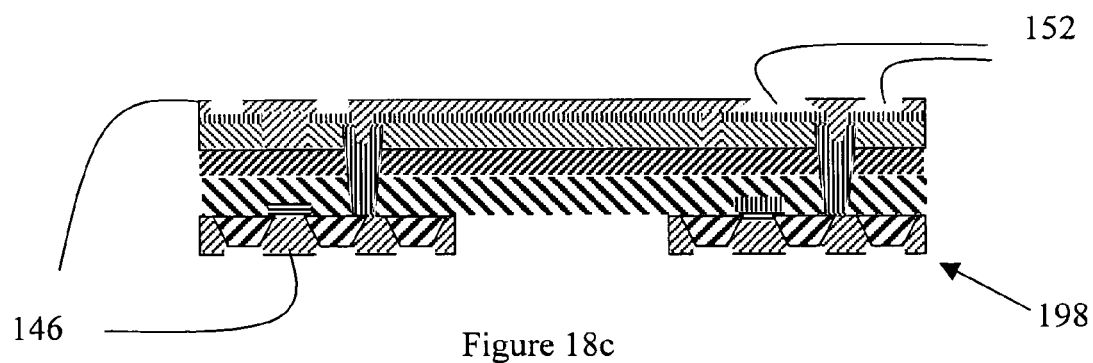
FIG. 18*c* shows a side view of the circuit board of FIG. 18*b* after a flexible solder mask has been applied.

FIG. 18c shows a side view of circuit board 198 after flexible solder mask 146 (with openings 152) has been applied (as described above), as shown.

Figure 18D:
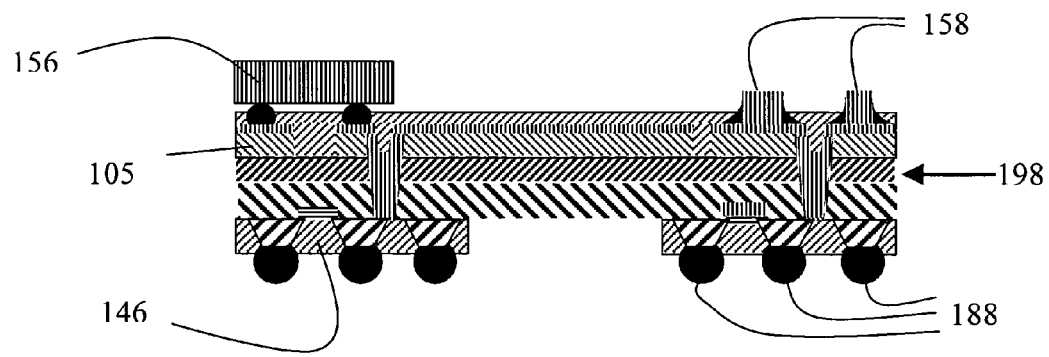
FIG. 18*d* shows a side view of the circuit board of FIG. 18*b* after solder balls and electrical components have been added.

FIG. 18d shows a side view of circuit board 198 after solder balls 188, electrical components 156' and hardware items 158' have been added (as described above), as shown.

Figure 18E:
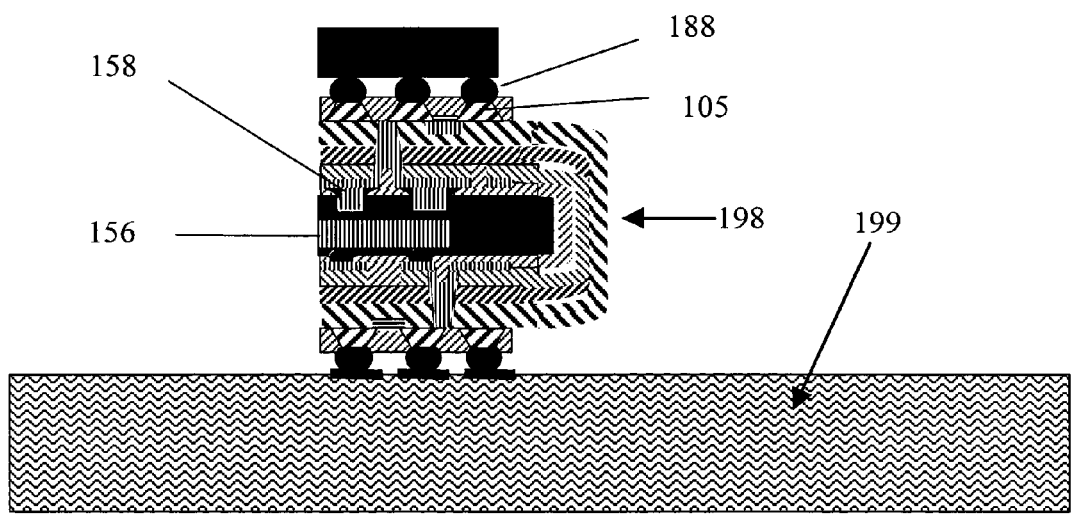
FIG. 18*e* shows a side view of the circuit board of FIG. 18*b* after the circuit board has been flexed and folded.

FIG. 18e shows a side view of circuit board 198 after the circuit board has been flexed and folded, such as for example for installation on circuit board 199, as shown. For example circuit board 198 may be used for high density high flexural use (called dynamic flex) or used as one-time fold to provide 3-dimensional Z-axis build-up system packaging used in what is called system in a package (SIP) in microelectronic devices. Preferably, the processes are similar to the above described methods except that preferably adhesive 120 is applied to the entire metal support carrier 190. Preferably, for circuit board 198, there no need for adhesive gap or pre-etched grooves for bending metal support carrier 190 since the majority of metal support carrier 190 is removed to provide flexibility. Preferably, metal support carrier 190 provides support for the manufacture and processing and buildup of the flexible layers 122, etc.

FIG. 19a and FIG. 19b (which is a continuation of FIG. 19a) show a preferred process for manufacturing rigid-flex according to a preferred embodiment of the present invention.

FIGS. 20a-20e show that rigid core portion may comprise semiconductor material, and that the methods taught herein can be used to produce semiconductors which can be bent and/or flexed (such as, for example, for installation).

Figure 20A:
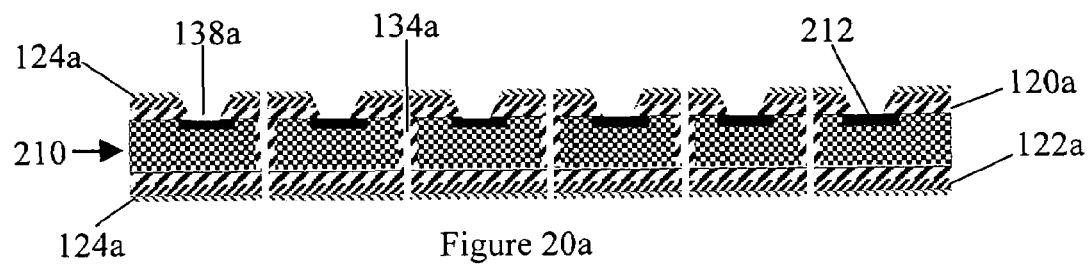
FIG. 20*a* shows a side view of rigid flex semiconductor according to a preferred embodiment of the present invention.

FIG. 20a shows a side view of rigid flex semiconductor 210 according to a preferred embodiment of the present invention. Preferably rigid flex semiconductor, 210 comprises semiconductor substrate. Preferably, semiconductor substrate is a solid chemical element or compound that conducts electricity under certain conditions, such as, for example, Gallium Arsenide (GaAs), Silicon Germanium (SiGe), Indium phosphide (InP), Gallium Nitride (GaN), Aluminum Nitride (AiN), Indium Gallium Arsenide Nitride (InGaAsN), etc. Silicon semiconductor wafer materials with build up layers and conductive patterns and semi-conductive materials may be used as integrated circuits for cell phones, pagers, memory chips and many more devices. This flexible material build up process allows a conductive pattern layer on the outside of the semiconductor wafer which now can be a flexible circuit, after removal of material in selective areas by laser cut or mechanical wafer sawing. This process can be single sided or on both sides and can be repeated for multilayers. Preferably the methods of manufacture and buildup are as described above. Preferably, rigid flex semiconductor 210 comprises bonding pads 212, as shown.

Figure 20B:
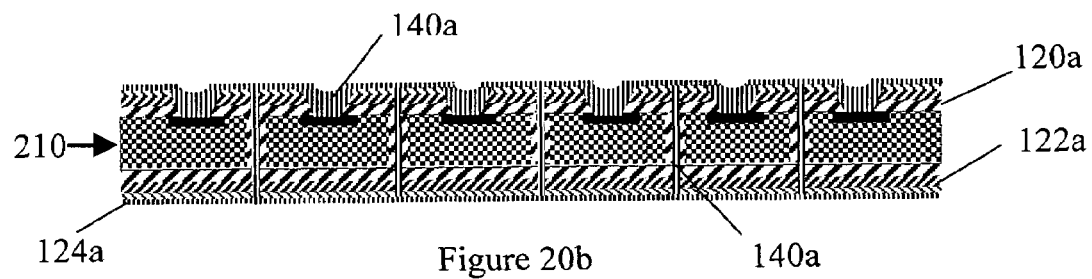
FIG. 20*b* shows a side view of the rigid flex semiconductor of FIG. 20*a* after conductive material has been applied.

FIG. 20b shows a side view of the rigid flex semiconductor 210 after conductive material 140a has been applied.

Figure 20C:
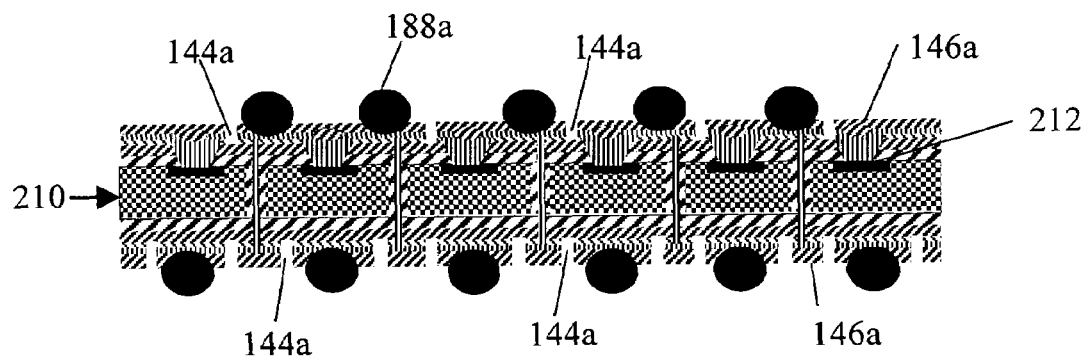
FIG. 20*c* shows a side view of the rigid flex semiconductor of FIG. 20*b* after it has been printed and etched and solder balls have been applied.

FIG. 20c shows a side view of the rigid flex semiconductor 210 after it has been plated, printed, etched and solder mask applied 146a and solder balls 188a have been applied.

Figure 20D:
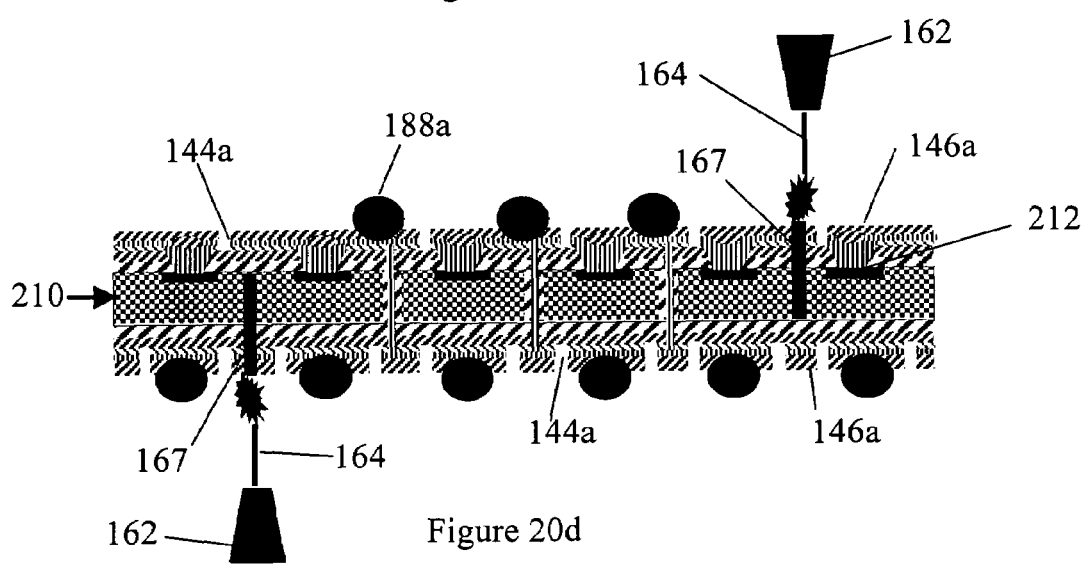
FIG. 20*d* shows a side view of the rigid flex semiconductor of FIG. 20*c* being cut by lasers so that it can be flexed and bent.

FIG. 20d shows a side view of the rigid flex semiconductor 210 being cut by laser drill 162 to create cuts 167 so that it can be flexed and bent.

Figure 20E:
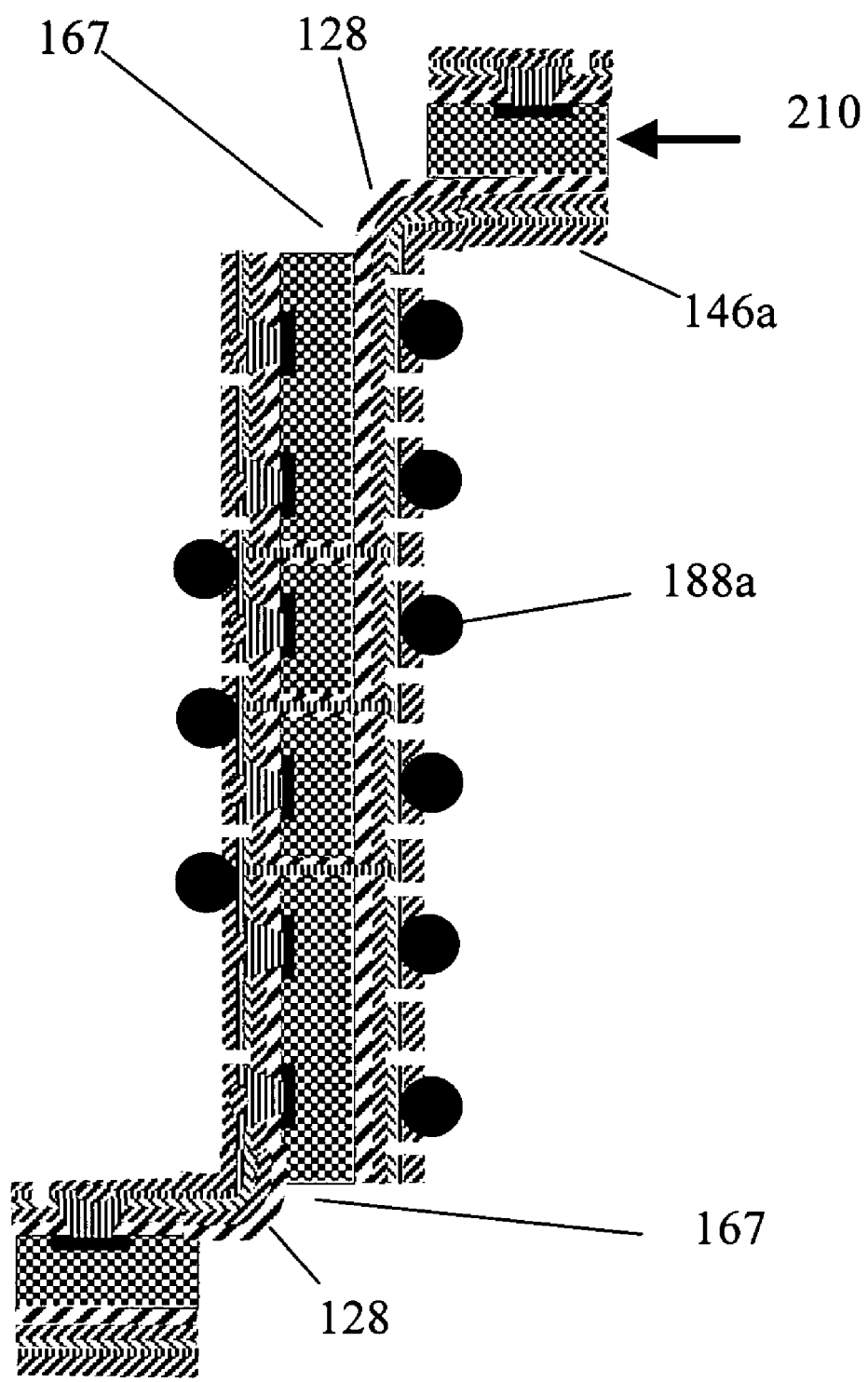
FIG. 20*e* shows a side view of the rigid flex semiconductor of FIG. 20*d* after it has been flexed and bent.

FIG. 20e shows a side view of the rigid flex semiconductor 210 after it has been flexed and bent at the location of cuts 167 with flexible connections 128 formed by flexible layers such as, for example, adhesive and solder mask 146a, as shown.

Although applicant has described applicant's preferred embodiments of this invention, it will be understood that the broadest scope of this invention includes such modifications as diverse shapes and sizes and materials. Such scope is limited only by the below claims as read in connection with the above specification.

Further, many other advantages of applicant's invention will be apparent to those skilled in the art from the above descriptions and the below claims.

What is claimed is:

1. A rigid-flex printed circuit board system comprising, in combination:
    a) at least one rigid layer:
    b) wherein said at least one rigid layer comprises
        i) at least one top side, and
        ii) at least one bottom side;
    c) at least one first flexible layer bonded to at least one first portion of said at least one top side;
    d) at least one second flexible layer bonded to at least one second portion of said at least one bottom side;
    e) wherein said at least one rigid layer comprises at least one first structural weakness at least one first selected location;
    f) wherein said at least one first structural weakness is structured and arranged to facilitate breaking said at least one rigid layer at such at least one first selected location into at least two rigid pieces to provide at least one first flexible connection formed by said at least one first flexible layer between such rigid pieces;
    g) wherein said at least one rigid layer comprises at least one second structural weakness at at least one second selected location; and
    h) wherein said at least one second structural weakness is adapted to facilitate breaking said at least one rigid layer at such at least one second selected location into at least two second rigid pieces to provide at least one second flexible connection formed by said at least one second flexible layer between such second rigid pieces.

2. The rigid-flex printed circuit board system according to claim 1 wherein such first structural weakness comprises at least one score that partially penetrates said at least one rigid layer.

3. The rigid-flex printed circuit board system according to claim 2 wherein said at least one score penetrates about two-thirds of the total thickness of said at least one rigid layer.

4. The rigid-flex printed circuit board system according to claim 1 wherein:
    a) said structural weakness comprises
        i) at least one top score on said at least one top side at such at least one first selected location, and
        ii) at least one bottom score on said at least one bottom side at such at least one first elected location.

5. The rigid-flex printed circuit board system according to claim 1 further comprising:
    a) at least one adhesive to bond at least one flexible layer portion of said at least one first flexible layer to at least one rigid layer portion of said at least one rigid layer;
    b) wherein said structural weakness comprises selective absence of adhesive at such selected location between said at least one rigid layer and said at least one flexible layer.

6. The rigid-flex printed circuit board system according to claim 1 wherein said at least one first structural weakness comprises at least one laser score.

7. The rigid-flex printed circuit board system according to claim 1 wherein said at least one first structural weakness comprises at least one mechanical score.

8. The rigid-flex printed circuit board system according to claim 1 wherein said at least one rigid layer comprises fiberglass.

9. The rigid-flex printed circuit board system according to claim 1 wherein said at least one first flexible layer comprises polyimide.

10. The rigid-flex printed circuit board system according to claim 1 wherein:
    a) said at least one first flexible layer comprises
        i) at least one substantially flexible insulating layer, and
        ii) at least one substantially flexible conductive layer; and
    b) said at least one rigid layer comprises
        i) at least one substantially rigid insulating layer, and
        ii) at least one conductive layer.

11. The rigid-flex printed circuit board system according to claim 1 wherein said at least one first structural weakness comprises at least one groove.

12. The rigid-flex printed circuit hoard system according to claim 1 wherein said at least one first structural weakness comprises at least one chemically milled groove.

13. The rigid-flex printed circuit hoard system according to claim 1 wherein
    a) said at least one first flexible layer comprises at least one top outermost layer; and
    b) said at least one second flexible layer comprises at least one bottom outermost layer.

14. The rigid-flex printed circuit board system according to claim 1 further comprising at least one breakaway portion.

15. The rigid-flex printed circuit board system according to claim 1 wherein
    a) said at least one first flexible connection is structured and arranged to provide upwardly concave flexure at said at least one first selected location; and
    b) said at least one second flexible connection is structured and arranged to provide downwardly concave flexure at said at least one second selected location.

* * * * *